(12) United States Patent
Kim et al.

(10) Patent No.: US 9,087,769 B2
(45) Date of Patent: Jul. 21, 2015

(54) MAGNETIC MEMORY DEVICE

(71) Applicants: Yong-kwan Kim, Yongin-si (KR);
Dae-eun Jeong, Yongin-si (KR);
Shin-hee Han, Seongnam-si (KR)

(72) Inventors: Yong-kwan Kim, Yongin-si (KR);
Dae-eun Jeong, Yongin-si (KR);
Shin-hee Han, Seongnam-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 14/338,285

(22) Filed: Jul. 22, 2014

(65) Prior Publication Data

US 2015/0061054 A1    Mar. 5, 2015

(30) Foreign Application Priority Data

Aug. 30, 2013   (KR) .................. 10-2013-0104507

(51) Int. Cl.
*H01L 27/22* (2006.01)
*H01L 43/08* (2006.01)
*H01L 43/02* (2006.01)

(52) U.S. Cl.
CPC .............. *H01L 27/228* (2013.01); *H01L 43/02* (2013.01); *H01L 43/08* (2013.01)

(58) Field of Classification Search
CPC ........ H01L 27/228; H01L 43/02; H01L 43/08
See application file for complete search history.

(56) References Cited

U.S. PATENT DOCUMENTS

| 7,777,264 | B2 | 8/2010 | Voshell et al. | |
| 8,629,494 | B2* | 1/2014 | Kim et al. | 257/334 |
| 2007/0296007 | A1 | 12/2007 | Park et al. | |
| 2009/0236658 | A1 | 9/2009 | Gruening-von Schwerin | |
| 2012/0086074 | A1* | 4/2012 | Hwang et al. | 257/334 |
| 2012/0286339 | A1 | 11/2012 | Asao | |
| 2013/0153998 | A1* | 6/2013 | Song et al. | 257/334 |
| 2013/0221306 | A1* | 8/2013 | Nam et al. | 257/1 |
| 2014/0054721 | A1* | 2/2014 | Nam et al. | 257/401 |
| 2014/0162427 | A1* | 6/2014 | Gwak | 438/381 |
| 2015/0035096 | A1* | 2/2015 | Han et al. | 257/421 |

FOREIGN PATENT DOCUMENTS

| EP | 2269192 A | 1/2011 |
| JP | 2008218514 A | 9/2008 |
| KR | 19950028121 | 10/1995 |
| KR | 101004506 B1 | 12/2010 |
| KR | 101049589 B1 | 7/2011 |
| KR | 101154468 B1 | 6/2012 |
| KR | 101218097 | 1/2013 |
| KR | 20130017647 A | 2/2013 |

* cited by examiner

*Primary Examiner* — Allan R Wilson

(74) *Attorney, Agent, or Firm* — Renaissance IP Law Group LLP

(57) ABSTRACT

A magnetic memory device is provided. The magnetic memory device may include a plurality of word lines extending along a direction crossing a plurality of active regions and at least one source line connected to a plurality of first active regions arranged on a level that is lower than the upper surface of a substrate. A plurality of contact pads may be connected to a plurality of second active regions and a plurality of buried contact plugs may be connected to the plurality of second active regions via the plurality of contact pads. Said buried contact pads may further be arranged in a hexagonal array structure. A plurality of variable resistance structures may be connected to the plurality of second active regions and arranged in a hexagonal array structure.

20 Claims, 40 Drawing Sheets

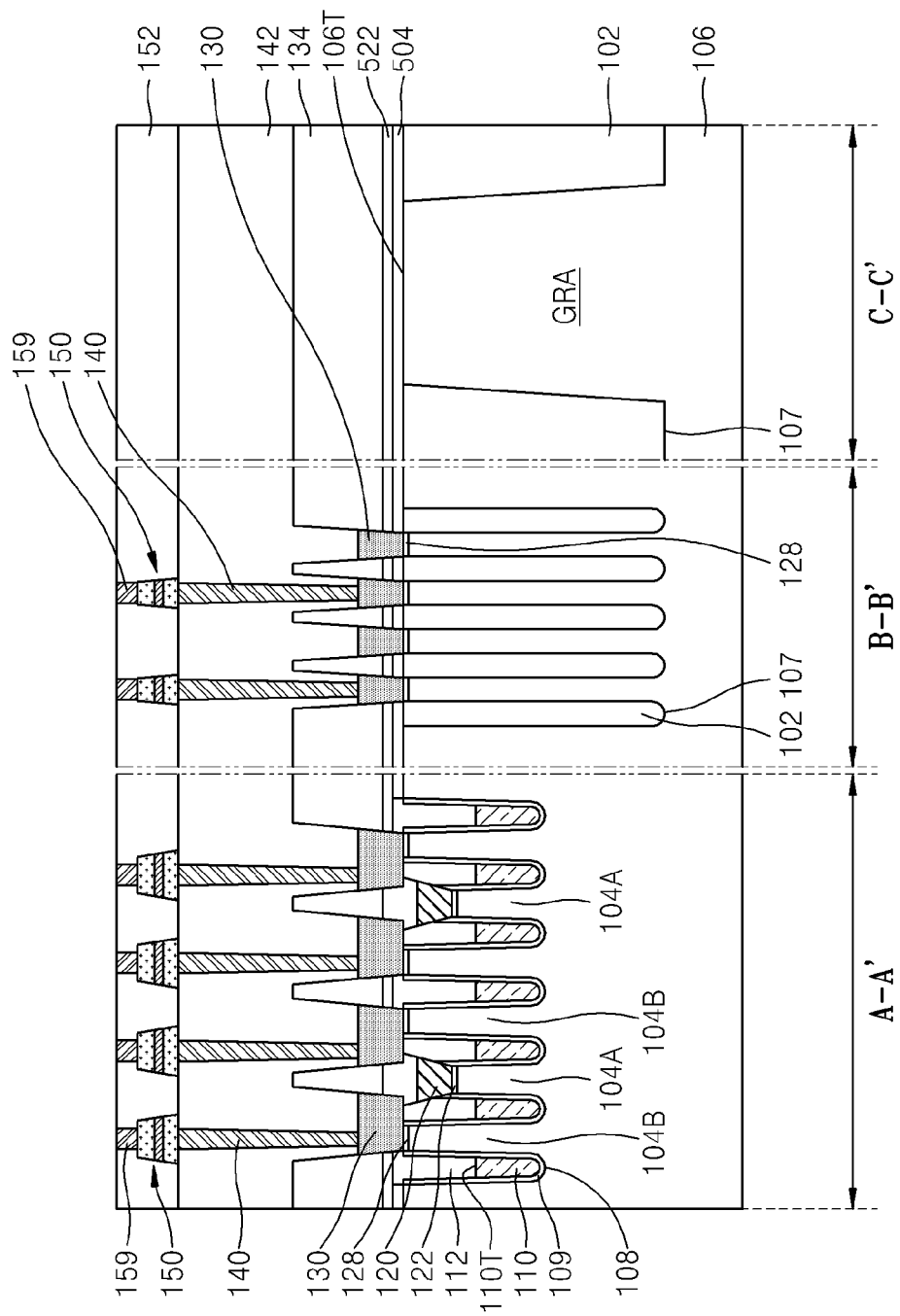

MAGNETIC MEMORY DEVICE

CROSS-REFERENCE TO RELATED APPLICATIONS

This application claims the benefit of Korean Patent Application No. 10-2013-0104507, filed on Aug. 30, 2013, in the Korean Intellectual Property Office, the disclosure of which is incorporated herein by reference in its entirety.

BACKGROUND

The inventive concepts relate to a magnetic memory device, and more particularly, to a magnetic memory device having a plurality of source lines arranged in a cell array region.

Along with miniaturization, increased integration and the ability to perform multiple functions in semiconductor products, a large capacity of data needs to be processed in a small area. Accordingly, research is being conducted with respect to devices capable of micronizing a pattern of a memory device to be used in semiconductor products to provide high integration with increased operating speeds. Recently, a new light-exposure technique and expensive processing techniques have been implemented for micronizing a pattern of a highly integrated device, and continual research is being conducted to provide new integration techniques.

SUMMARY

The inventive concepts provide a magnetic memory device including micro-patterns that are provided in an arrangement structure conducive to high integration.

According to an aspect of the inventive concepts, a magnetic memory device may include a substrate in which a plurality of active regions extending in parallel to each other along a first direction are defined. A plurality of word lines extend on the plurality of active regions along a second direction crossing the first direction, and at least one source line may be provided which is connected to a plurality of first active regions selected from among the plurality of active regions and extending along the second direction. A plurality of contact pads may be connected to a plurality of second active regions selected from among the plurality of active regions. A plurality of buried contact plugs may be connected to the plurality of second active regions via the plurality of contact pads and arranged in a hexagonal array structure. And a plurality of variable resistance structures may be connected to the plurality of second active regions via the plurality of contact pads, and may be arranged in a hexagonal array structure.

The source line(s) may extend on a third level between a first level (on which the plurality of word lines are located) and a second level (on which the plurality of contact pads are located).

The plurality of contact pads may contact the upper surface of the substrate.

Each of the plurality of variable resistance structures may be arranged at a location where each of the plurality of variable resistance structures vertically overlaps a corresponding one of the plurality of buried contact plugs.

Among the plurality of buried contact plugs, a series of buried contact plugs formed on a series of contact pads arranged along the first direction may be arranged in a substantially straight line along the first direction, and a series of buried contact plugs formed on a series of contact pads arranged along the second direction may be arranged in a substantially zigzag pattern, wherein the locations of the buried contact plugs are arranged in alternating locations on the contact pads.

More particularly, among the plurality of buried contact plugs, in a first direction, adjacent buried contact plugs may be arranged in a substantially straight line. In the second direction, adjacent buried contact plugs may be arranged in a zigzag pattern.

The plurality of word lines may have a structure in which a pair of word lines and one isolated word line are alternately and repeatedly arranged, and the at least one source line may be connected to the plurality of active regions located between the pair of word lines.

The upper surfaces of the plurality of first active regions may be located on the first level, which is lower than the upper surface of the substrate between the pair of word lines. The upper surfaces of the plurality of second active regions may be located on the second level, which is higher than the first level at both sides of the isolated word line, with the isolated word line interposed between the first level and the second level. The source line(s) may contact the upper surfaces of the plurality of first active regions, and the plurality of contact pads may contact the upper surfaces of the plurality of second active regions.

The at least one source line may include a plurality of source lines arranged in parallel to each other, and the plurality of source lines may include partial source lines connected to each other.

The magnetic memory device may further include a mesh source line extending across the plurality of source lines, and the partial source lines may be connected to each other via the mesh source line.

The magnetic memory device may further include a mesh source line extending across the plurality of source lines to connect at least a portion of the plurality of source lines to each other, and an external source line connected to the mesh source line and arranged to surround the plurality of source lines.

According to another aspect of the inventive concepts, a magnetic memory device may include a substrate having a cell array region in which a plurality of active regions extend in parallel to each other along a first direction and a guard ring active region surrounding the cell array region. A plurality of word lines in the cell array region may extend in parallel to each other in a direction crossing the plurality of active regions. A plurality of source lines may be formed on a level that is lower than the upper surface of the substrate in the cell array region and may contact a plurality of first active regions selected from among the plurality of active regions. An external source line may be connected to at least a portion of the plurality of source lines in the cell array region surrounded by the guard ring active region. A plurality of buried contact plugs may be connected to a plurality of second active regions selected from among the plurality of active regions and may be arranged in a hexagonal array structure. And a plurality of variable resistance structures may be connected to the plurality of second active regions via the plurality of contact pads and arranged in a hexagonal array structure.

The magnetic memory device may further include at least one mesh source line extending across the plurality of source lines and connected to the plurality of source lines and the external source line.

The external source line may have a closed loop shape extending along a length direction of the guard ring active region.

The plurality of source lines may include a first source line section and a second source line section that are arranged in a straight line and spaced apart from each other. The external source line may include a first external source line section and a second external source line section that are spaced apart from each other. The first source line section may be connected to only the first external source line section among the first and second external source line sections, and the second source line section may be connected to only the second external source line section among the first and second external source line sections.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
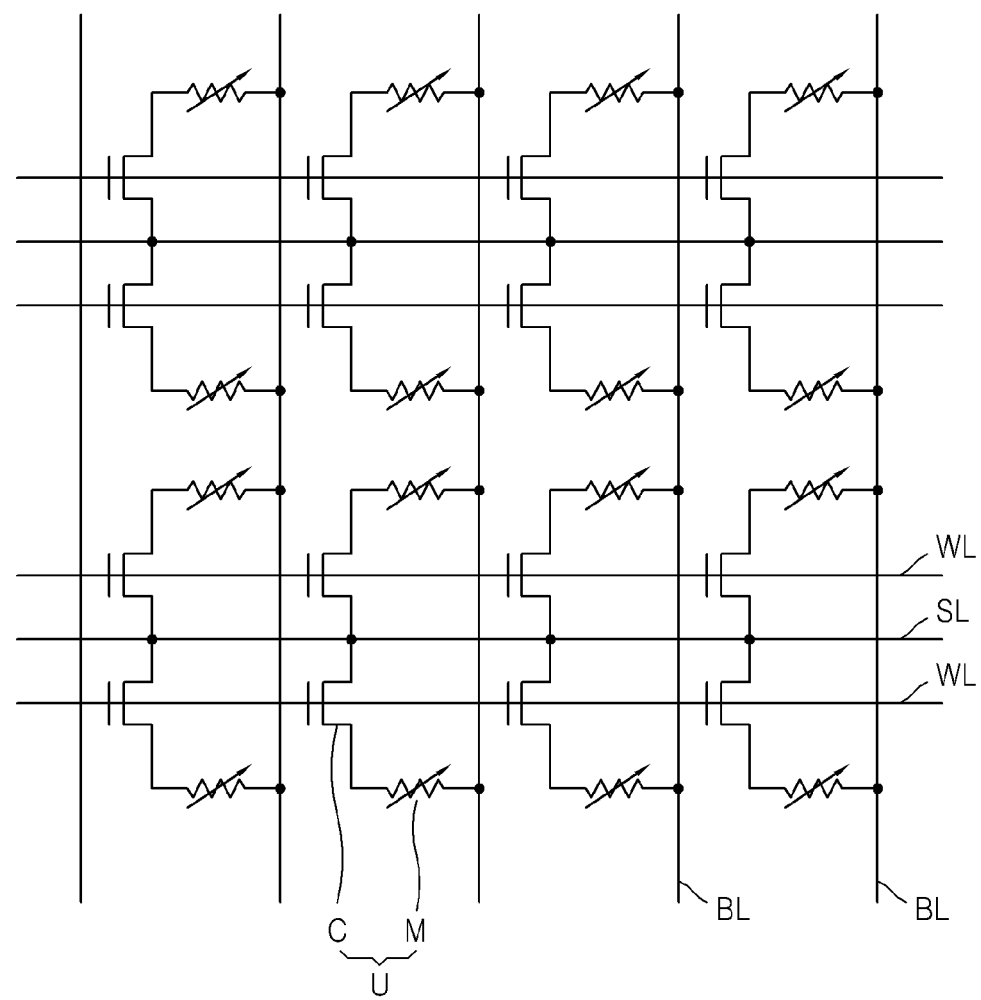
FIG. 1 is a schematic circuit diagram illustrating a memory cell array of a magnetic memory device according to one or more embodiments of the present inventive concepts.

The inventive concepts will now be described more fully with reference to the accompanying drawings, in which exemplary embodiments of the inventive concepts are shown. Like reference numerals in the drawings denote like elements, and redundant descriptions will be omitted.

The following embodiments are provided to fully describe the present inventive concepts to one of ordinary skill in the art. The inventive concepts may, however, be embodied in many different forms and should not be construed as being limited to the particular embodiments set forth herein. Rather, these embodiments are included to provide a thorough and complete disclosure, and to fully convey the concept of the present inventive concepts to one of ordinary skill in the art.

Although terms, such as "first" and "second", are used to describe various members, regions, layers, parts and/or elements, these members, regions, layers, parts and/or elements are not limited by the terms. These terms do not require a specific sequence, top and bottom location, or indicate superior and inferior elements, and are only used to distinguish a certain member, region, part, or element from another member, region, part, or element. Therefore, a first member, region, part, or element could be named a second member, region, part, or element without departing from the inventive concepts. For example, a first element can be termed a second element, and likewise, a second element could be termed a first element, without departing from the scope of the inventive concepts.

All terms used herein including technical or scientific terms have the same meaning as those generally understood by those of ordinary skill in the art unless they are expressly defined differently. It should be understood that terms generally used, which are defined in a dictionary, have the same meaning as used in the context of the related technology, and the terms used herein are not to be interpreted using an ideal or an excessively formal meaning unless they are clearly so defined in the application.

The embodiments disclosed herein may be differently implemented, and specific processing orders may be performed differently from the described order. For example, unless expressly stated to the contrary, two processes described sequentially may be performed substantially at the same time, or may be performed in a reverse order to the described order.

Departures from the shapes and sizes illustrated in the accompanying drawings are to be expected as a result, for example, of various manufacturing techniques and/or tolerances. Therefore, the embodiments of the present inventive concepts are not to be limited to specific shapes in the regions shown, and changes in shape caused, for example, by manufacturing processes are to be included within the scope of the inventive concepts.

As used herein, expressions such as "at least one of," when preceding a list of elements, modify the entire list of elements and do not modify the individual elements of the list.

FIG. 1 is a schematic circuit diagram illustrating a memory cell array of a magnetic memory device 10 according to one or more embodiments of the present inventive concepts.

Referring to FIG. 1, the memory cell array of the magnetic memory device 10 may include a plurality of unit cells U arranged in a matrix format. Each of the plurality of unit cells U may include an access unit C and a memory unit M. Each of the plurality of unit cells U may be electrically connected to a word line WL and a bit line BL. A plurality of word lines WL may be arranged substantially parallel to each other, with a plurality of bit lines BL arranged substantially parallel to each other but perpendicular to the word lines WL, such that the plurality of word lines WL and the plurality of bit lines BL cross each other. The access unit C may include a transistor with a source line SL connected to a source region of the access unit C.

The access unit C controls the supply of current to the memory unit M based upon a voltage of the word line WL. According to one or more embodiments of the present inventive concept, the access unit C may be a metal oxide semiconductor (MOS) transistor, a bipolar transistor, or a diode.

The memory unit M may include a magnetic material. According to one or more embodiments of the present inventive concepts, the memory unit M may include a magnetic tunnel junction (MTJ) element. According to one or more embodiments of the present inventive concepts, the memory unit M may perform a memory function by using a spin transfer torque (STT) effect, in which a magnetized direction of a magnetic body varies according to an input current.

Figure 2:
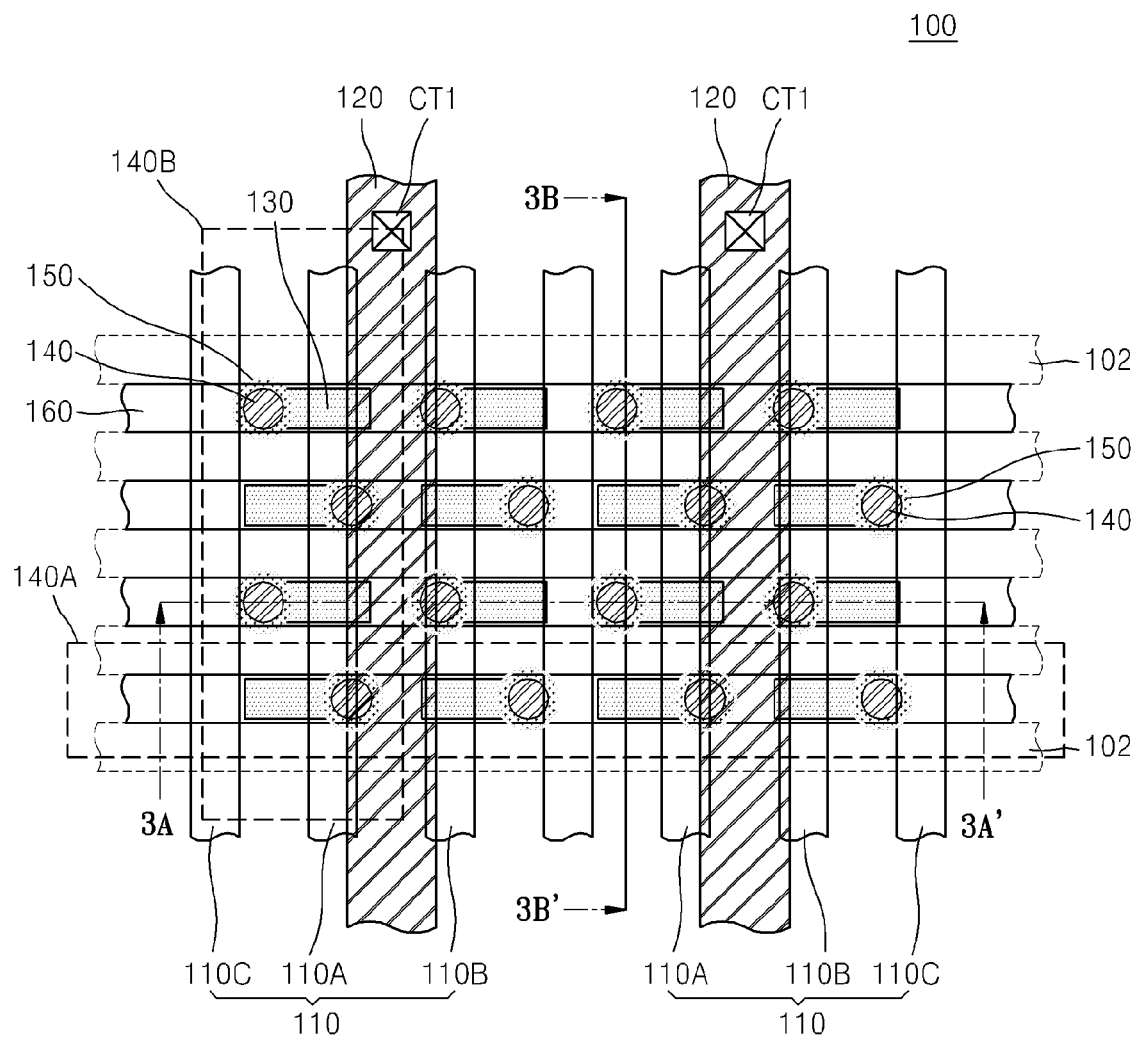
FIG. 2 is a schematic layout of a magnetic memory device according to one or more embodiments of the present inventive concepts.

FIG. 2 is a schematic layout of a magnetic memory device 100 according to one or more embodiments of the present inventive concepts. The layout of FIG. 2 may form a portion of a memory cell array region of the magnetic memory device 10 of FIG. 1. The magnetic memory device 100 may be applicable to a memory cell having a unit cell size of, for example, 6 $F^2$ or 7 $F^2$, wherein F denotes a minimum lithographic feature size.

Figure 3:
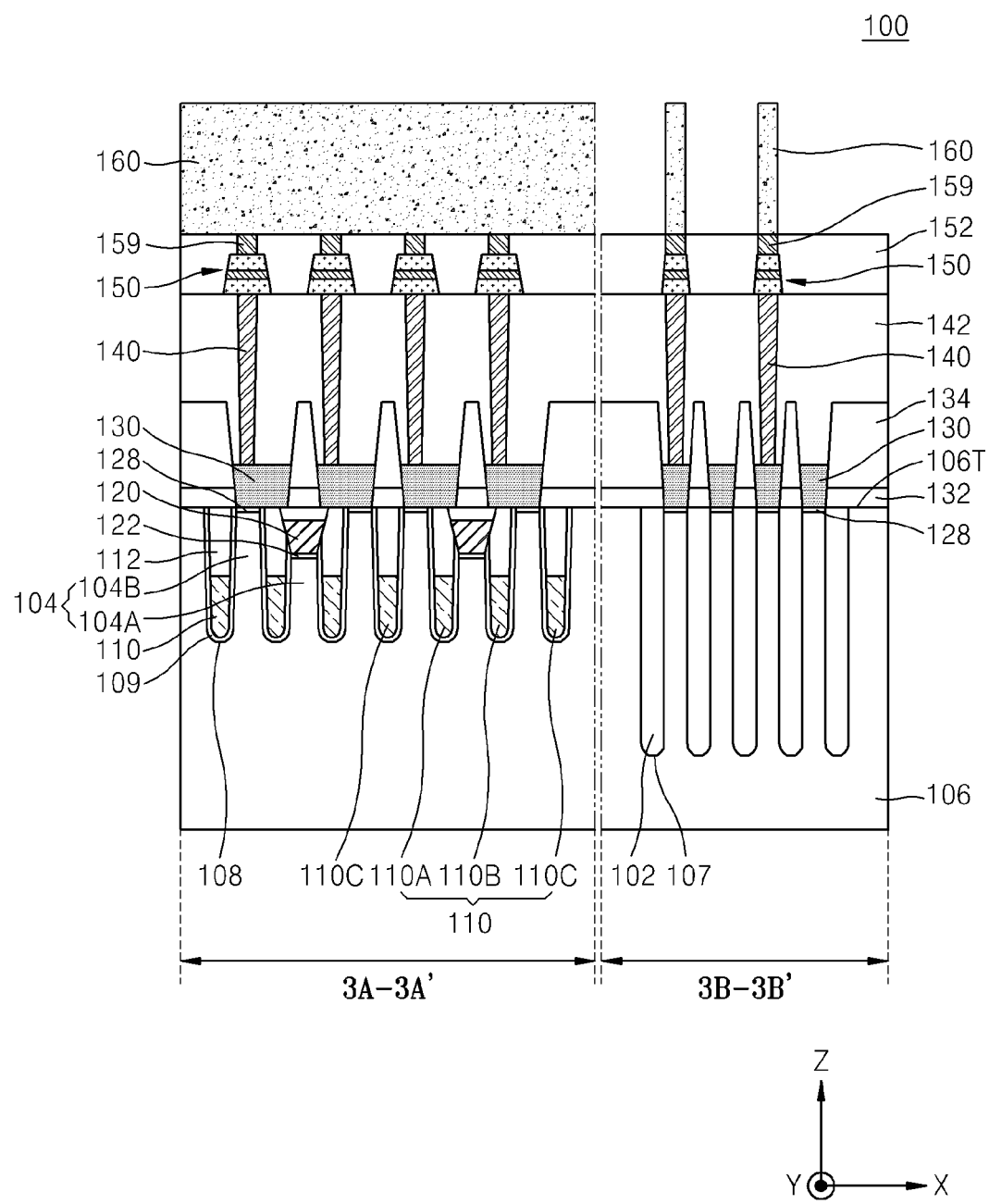
FIG. 3 provides somewhat schematic cross-sectional views of the magnetic memory device of FIG. 2, taken along line 3A-3A' and line 3B-3B' of FIG. 2.

FIG. 3 provides somewhat schematic cross-sectional views of the magnetic memory device 100 of FIG. 2, taken along line 3A-3A' and line 3B-3B' of FIG. 2.

Referring to FIGS. 2 and 3, the magnetic memory device 100 may include a substrate 106 on which a device isolation film 102 is formed. A plurality of active regions 104 are defined on the substrate 106 by the device isolation film 102 and extend in parallel to each other along a first direction (e.g., an X-axis direction in FIGS. 2 and 3). The device isolation film 102 is formed inside a device isolation trench 107 formed on the substrate 106.

The substrate 106 may be a semiconductor substrate. According to one or more embodiments of the present inventive concepts, the substrate 106 may include silicon (Si). According to other embodiments of the present inventive concepts, the substrate 106 may include a semiconductor element, such as germanium (Ge), or a composite semiconductor, such as silicon carbide (SiC), gallium arsenide (GaAs), indium arsenide (InAs), or indium phosphide (InP). According to one or more embodiments of the present inventive concepts, the substrate 106 may have a silicon on insulator (SOI) structure. For example, the substrate 106 may include a buried oxide (BOX) layer. According to one or more embodiments of the present inventive concepts, the substrate 106 may include a conductive region, such as a well doped with impurities or a structure doped with impurities.

A plurality of word lines 110 may extend on the plurality of active regions 104 along a second direction (e.g., a Y-axis direction in FIGS. 2 and 3) that crosses the first direction. The plurality of word lines 110 may include a plurality of word line pairs 110A and 110B and a plurality of isolated word lines 110C, wherein neighboring word lines 110A and 110B, forming a word line pair, and an isolated word line 110C are alternately and repeatedly arranged.

According to one or more embodiments of the present inventive concepts, the plurality of isolated word lines 110C may be electrically connected to each other. For example, the magnetic memory device 100 may include a conductive connection pattern (not shown) for electrically connecting the plurality of isolated word lines 110C to each other. The conductive connection pattern may be formed on the substrate on a level that is higher than the plurality of isolated word lines 110C, and the magnetic memory device 100 may further include a plurality of contact plugs (not shown) formed between the plurality of isolated word lines 110C and the conductive connection pattern to electrically connect the plurality of isolated word lines 110C to the conductive connection pattern. According to one or more embodiments of the present inventive concepts, the conductive connection pattern may extend onto a peripheral circuit region (not shown) arranged around a region in which the memory cell array of the magnetic memory device 10 of FIG. 1 is formed.

The plurality of word lines 110 may have a structure buried in the substrate 106, such that upper surfaces of the word lines 110 are arranged at a lower level than an upper surface 106T of the substrate 106. However, the present inventive concepts are not limited thereto.

The plurality of word lines 110 may be formed in a plurality of gate trenches 108 formed in the substrate 106. A plurality of gate dielectric films 109, interposed between the substrate 106 and the plurality of word lines 110, may be formed in the plurality of gate trenches 108. A plurality of buried insulation films 112 may fill the plurality of gate trenches 108 on top of the word lines 110.

According to one or more embodiments of the present inventive concepts, each of the plurality of word lines 110 may include at least one material selected from the group including a doped semiconductor, a metal, a conductive metal nitride, and a metal-semiconductor composite.

According to one or more embodiments of the present inventive concepts, the plurality of gate dielectric films 109 may include at least one material selected from the group including a silicon oxide film, a silicon nitride film, a silicon oxynitride film, an oxide/nitride/oxide (ONO), and a high-k dielectric film having a higher dielectric constant than the silicon oxide film.

According to one or more embodiments of the present inventive concepts, the plurality of buried insulation films 112 may include at least one material selected from the group including a silicon nitride film, a silicon oxide film, and a silicon oxynitride.

A plurality of source lines 120 may extend parallel to the plurality of word lines 110. Each of the plurality of source lines 120 may be located in a region between adjacent word lines 110A and 110B in a corresponding word line pair, and may be arranged at a level that is higher than the pair of word lines 110A and 110B and lower than the upper surface 106T of the substrate 106.

The plurality of active regions 104 may include a plurality of first active regions 104A and a plurality of second active regions 104B, wherein the first active regions 104A have upper surface levels different from upper surface levels of the second active regions 104B. The upper surfaces of the plurality of first active regions 104A may be located in the region between adjacent word lines 110A and 110B in the word line pairs and may further be located on a level that is lower than the upper surface 106T of the substrate 106. The upper surfaces of the plurality of second active regions 104B may be located on a level that is higher than the upper surfaces of the plurality of first active regions 104A, e.g., on a level that is the same or almost the same as the upper surface 106T of the substrate 106. The plurality of second active regions 104B may be located on both sides of each of the word line pairs 110A and 110B, with a pair of word lines 110A and 110B interposed between two second active regions 104B. The plurality of second active regions 104B may also be located on both sides of the isolated word lines 110C, by interposing an isolated word line 110C between second active regions 104B.

The plurality of source lines 120 may be connected to the plurality of first active regions 104A of the plurality of active regions 104 on a level that is lower than the upper surface 106T of the substrate 106.

A metal silicide film 122 may be formed between each of the plurality of source lines 120 and a corresponding one of the plurality of active regions 104. The metal silicide film 122 may function to reduce a contact resistance between the source line 120 and a source/drain region formed in the first active region 104A. However, according to the present inventive concepts, the metal silicide film 122 may be omitted, and the plurality of source lines 120 and corresponding ones of the plurality of first active regions 104A may directly contact each other.

According to one or more embodiments of the present inventive concepts, each of the plurality of source lines 120 may be connected to a source connection line via a contact CT1. Each of the plurality of source lines 120 may extend onto the peripheral circuit region arranged around the memory cell array region via the source connection line. The source connection line may be formed on a level that is higher than the upper surface 106T of the substrate 106.

The plurality of source lines 120 may be electrically connected to each other. According to one or more embodiments of the present inventive concepts, to electrically connect the plurality of source lines 120 to each other, the magnetic memory device 100 may further include at least one of a mesh source line and an external source line. The mesh source line may be configured as one body that extends across at least a portion of the plurality of source lines 120 and is connected to at least a portion of the plurality of source lines 120. The external source line may surround the plurality of source lines 120. The mesh source line and the external source line will be described below in more detail with reference to FIGS. 5A to 7B.

A plurality of contact pads 130 formed on the substrate 106 are connected to corresponding ones of the plurality of second active regions 104B. The plurality of contact pads 130 may be connected to the plurality of second active regions 104B by extending through a first insulation film 132 and a second insulation film 134 that are sequentially stacked on the substrate 106. A metal silicide film 128 may be formed between each of the plurality of contact pads 130 and a corresponding one of the plurality of second active regions 104B. The metal silicide film 128 may function to reduce a contact resistance between the plurality of contact pads 130 and source/drain regions formed in the plurality of second active regions 104B. However, according to the present inventive concepts, the metal silicide film 128 may be omitted, and the plurality of contact pads 130 and the plurality of second active regions 104B may directly contact each other.

The plurality of source lines 120 may be arranged on a third level located between a first level, on which the plurality of word lines 110 are located, and a second level, on which the plurality of contact pads 130 are located.

A plurality of buried contact plugs 140 may be formed on the plurality of contact pads 130 and connected to the plurality of second active regions 104B via the plurality of contact pads 130, and may further be arranged in a hexagonal array structure.

The plurality of buried contact plugs 140 may extend through a third insulation film 142 formed on the plurality of contact pads 130 to contact the upper surfaces of the plurality of contact pads 130.

Among the plurality of buried contact plugs 140, a first series of buried contact plugs 140A may be formed in a substantially straight line on a corresponding series of contact pads 130 that are arranged extending in the first direction (e.g., the X-axis direction), which corresponds to the direction in which the plurality of active regions 104 extend. A second series of buried contact plugs 140B may be formed in a substantially zigzag pattern on a corresponding series of contact pads 130 that are arranged extending in the second direction (e.g., the Y-axis direction), which corresponds to a direction in which the plurality of source lines 120 extend.

A plurality of variable resistance structures 150 may be formed on the plurality of buried contact plugs 140. The plurality of variable resistance structures 150 are separated from each other by a fourth insulation film 152. The plurality of variable resistance structures 150 may be connected to the plurality of second active regions 104B via the plurality of buried contact plugs 140 and the plurality of contact pads 130.

Each of the plurality of variable resistance structures 150 may be arranged at a location where the variable resistance structure 150 vertically overlaps a corresponding one of the plurality of buried contact plugs 140. Therefore, the plurality of variable resistance structures 150 may be arranged in a manner similar to the plurality of buried contact plugs 140, with a first series of variable resistance structures 150 arranged in a substantially straight line in the first direction (the X-axis direction), and a second series of variable resistance structures 150 arranged in a zigzag pattern in the second direction (the Y-axis direction).

A plurality of bit lines 160 may be formed on the plurality of variable resistance structures 150. The plurality of bit lines 160 may extend parallel to each other in the first direction (the X-axis direction) and may be electrically connected to the plurality of variable resistance structures 150 via a plurality of contact plugs 159. The plurality of bit lines 160 may be electrically connected to the source/drain regions formed in the plurality of second active regions 104B via the plurality of variable resistance structures 150, the plurality of buried contact plugs 140, and the plurality of contact pads 130.

According to one or more embodiments of the present inventive concepts, the plurality of bit lines 160 may include at least one material selected from the group including a metal, a conductive metal nitride, a metal-semiconductor composite, and a doped semiconductor. For example, the plurality of bit lines 160 may include a barrier film formed of tantalum (Ta), titanium (Ti), tantalum nitride (TaN), titanium nitride (TiN), or a combination thereof and a metal film, e.g., a copper (Cu) film, formed on the barrier film.

Each of the plurality of variable resistance structures 150 may store data between a corresponding bit line 160 and a corresponding buried contact plug 140 according to a resistance state thereof. Each of the plurality of variable resistance structures 150 may have an MTJ structure.

Figure 4:
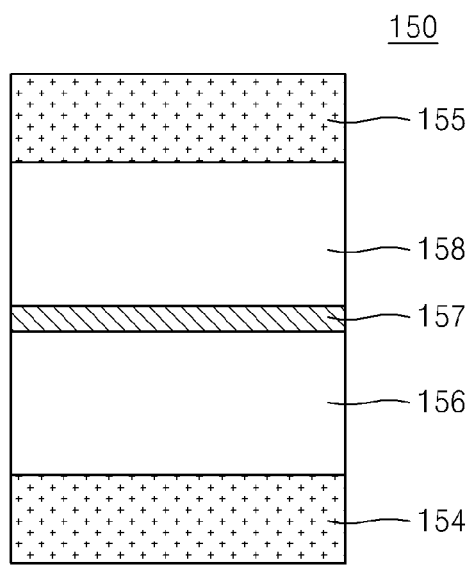
FIG. 4 is a schematic cross-sectional view illustrating a variable resistance structure of the device shown in FIGS. 2 and 3.

FIG. 4 is a schematic cross-sectional view of the variable resistance structure 150 of FIGS. 2 and 3.

Referring to FIG. 4, the variable resistance structure 150 may include a first magnetized layer 156, a tunnel barrier layer 157, and a second magnetized layer 158 sequentially stacked between a lower electrode 154 and an upper electrode 155. Any one of the first magnetized layer 156 and the second magnetized layer 158 may include a fixed layer, and the other one thereof may include a free layer, but the present inventive concepts are not limited thereto. For example, the first magnetized layer 156 or the second magnetized layer 158 may include at least one fixed layer and at least one free layer. In addition, although FIG. 4 shows a configuration including one tunnel barrier layer 157, the present inventive concepts are not limited thereto, and a plurality of tunnel barrier layers may be included between the lower electrode 154 and the upper electrode 155.

The fixed layer has a fixed magnetization direction with a magnetization easy axis in a direction that is orthogonal to a film surface. The free layer has a variable magnetization direction with a magnetization easy axis in a direction that is orthogonal to the film surface.

An MTJ resistance value of the variable resistance structure 150 may vary according to a magnetization direction of each of the first magnetized layer 156 and the second magnetized layer 158. For example, if the magnetization directions of the first magnetized layer 156 and the second magnetized layer 158 are antiparallel to each other, the variable resistance structure 150 may have a relatively high resistance value and store data of '1'. If the magnetization directions of the first magnetized layer 156 and the second magnetized layer 158 are parallel to each other, the variable resistance structure 150 may have a relatively low resistance value and store data of '0'. By using such a difference between resistance values, data may be written on or read from the magnetic memory device 100.

According to one or more embodiments of the present inventive concepts, the variable resistance structure 150 may be used to implement a perpendicular MTJ element. According to one or more embodiments of the present inventive concepts, the magnetization direction in the free layer of the variable resistance structure 150 may vary by an STT.

According to other one or more embodiments of the present inventive concepts, the variable resistance structure 150 may include a horizontal MTJ structure in which a flow direction of a current is substantially orthogonal to the magnetization easy axis.

The lower electrode 154 and the upper electrode 155 may include a conductive material of which reactivity is relatively low. According to one or more embodiments of the present inventive concepts, the lower electrode 154 and the upper electrode 155 may include a conductive metal nitride. For example, each of the lower electrode 154 and the upper electrode 155 may have a single layer formed of at least one material selected from the group including Ti, Ta, ruthenium (Ru), TiN, TaN, and tungsten (W) or a multi-layer structure including a plurality of materials.

The tunnel barrier layer 157 may have a thickness that is less than a spin diffusion distance. The tunnel barrier layer 157 may include a non-magnetic material. According to one or more embodiments of the present inventive concepts, the tunnel barrier layer 157 may be formed of an oxide of any one of magnesium (Mg), Ti, aluminum (Al), magnesium-zinc (MgZn), and magnesium-boron (MgB). According to other one or more embodiments of the present inventive concepts, the tunnel barrier layer 157 may be formed of a titanium nitride or a vanadium nitride.

According to one or more embodiments of the present inventive concepts, at least one of the first magnetized layer 156 and the second magnetized layer 158 may include at least one material selected from the group including iron (Fe), cobalt (Co), nickel (Ni), palladium (Pd), and platinum (Pt). According to one or more embodiments of the present inventive concepts, at least one of the first magnetized layer 156 and the second magnetized layer 158 may be formed of a Co-M1 alloy (where M1 denotes at least one metal selected from the group consisting of Pt, Pd and Ni) or an Fe-M2 alloy (where M2 denotes at least one metal selected from the group consisting of Pt, Pd and Ni). According to other one or more embodiments of the present inventive concepts, at least one of the first magnetized layer 156 and the second magnetized layer 158 may further include at least one material selected from the group including boron (B), carbon (C), Cu, silver (Ag), gold (Au), Ru, Ta, and chromium (Cr).

According to one or more embodiments of the present inventive concepts, at least one of the first magnetized layer 156 and the second magnetized layer 158 may include a perpendicular magnetic anisotropy (PMA) material. According to one or more embodiments of the present inventive concepts, at least one of the first magnetized layer 156 and the second magnetized layer 158 may include a synthetic anti-ferromagnetic (SAF) structure. The SAF structure is a structure in which a Ru intermediate layer is inserted into a ferromagnetic stacked structure. For example, the SAF structure hay have a multi-layer structure including CoFeB/Ta/ $(Co/Pt)_m/Ru/(Co/Pd)_n$ (where m and n are natural numbers). An SAF structure employable in a magnetic memory device according to the present inventive concepts is not limited to the SAF structure described above, however, and a variety of modified structures may be employed therein.

By forming the plurality of source lines 120 on a level that is lower than the upper surface 106T of the substrate 106 in the magnetic memory device 100 of FIGS. 2 and 3, the height of the plurality of buried contact plugs 140 may be lowered. Therefore, a process margin for forming the plurality of buried contact plugs 140 in a high density arrangement may be more easily secured.

In addition, to implement a highly integrated magnetic memory device, by designing the plurality of variable resistance structures 150 to have a hexagonal array structure, an etching process may be relatively easy to perform when a structure of a plurality of stacked layers including magnetic layers is etched to form the plurality of variable resistance structures 150. If the plurality of source lines 120 are formed on a level that is higher than the upper surface 106T of the substrate 106, a decrease in a cell area may occur as a result of a source line design when the plurality of variable resistance structures 150 are formed in a hexagonal array structure, thereby decreasing the competitiveness of the products. However, according to the present inventive concepts, by forming the plurality of source lines 120 on a level that is lower than the upper surface 106T of the substrate 106, the plurality of variable resistance structures 150 arranged in a hexagonal array structure may be easily formed regardless of a source line design.

In addition, since the plurality of variable resistance structures 150 and the plurality of buried contact plugs 140 are arranged to vertically overlap each other in a hexagonal array structure, a separate contact pad does not have to be formed between the plurality of buried contact plugs 140 and the plurality of variable resistance structures 150 to form the plurality of variable resistance structures 150 in a hexagonal array structure. Furthermore, the plurality of contact pads 130 are located below the plurality of buried contact plugs 140 and are separated from the plurality of variable resistance structures 150. Therefore, problems can be avoided that might otherwise occur when a structure having a plurality of stacked layers is etched to form the plurality of variable resistance structures 150. Among other things, an electrical short that might otherwise be caused by etching a conductive material forming a contact pad exposed from the bottom can be avoided. Accordingly, a process of forming the plurality of variable resistance structures 150 may be more effectively performed without causing problems such as an electrical short.

Figure 5A:
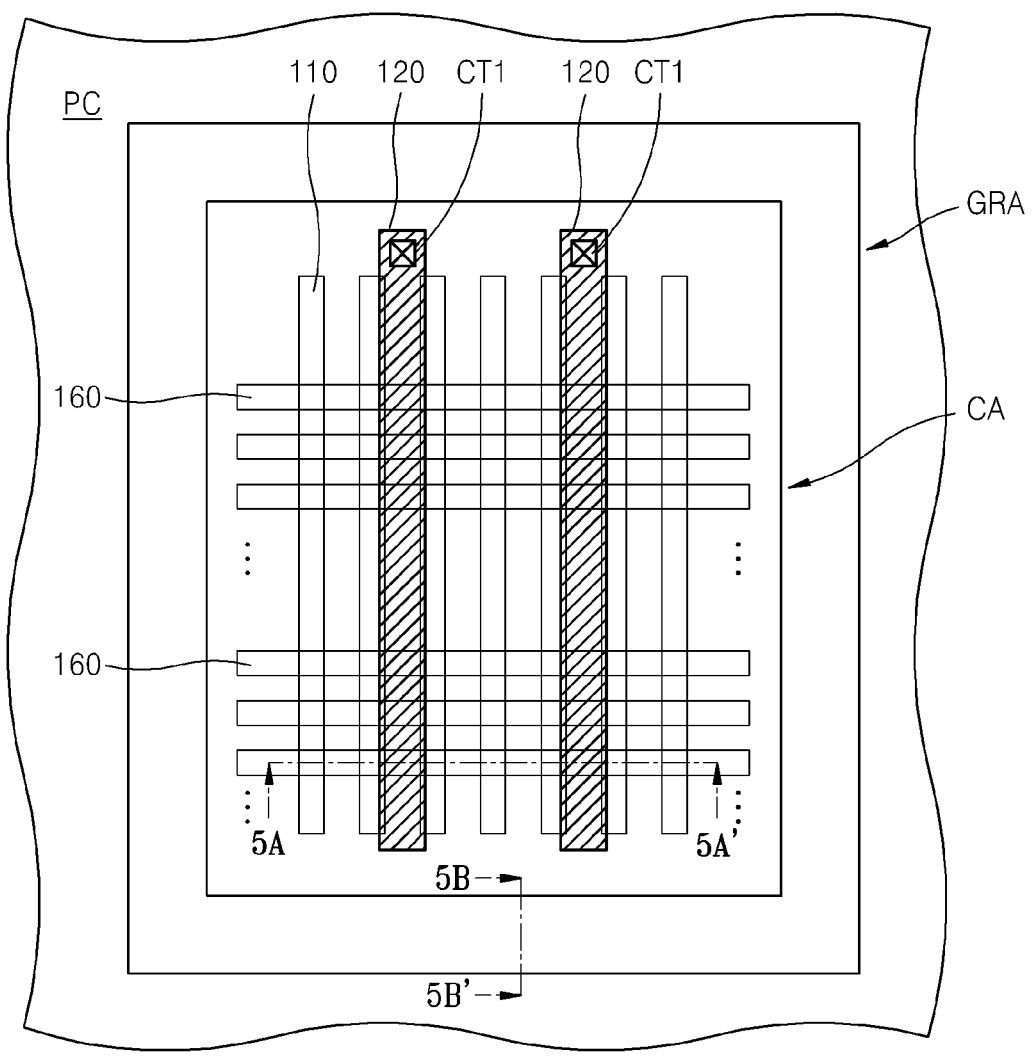
FIG. 5A is a schematic top view illustrating primary components of a magnetic memory device according to one or more embodiments of the present inventive concepts, and FIG. 5B provides somewhat schematic partial cross-sectional views of the magnetic memory device taken along line 5A-5A' and line 5B-5B' of FIG. 5A.
Figure 5B:
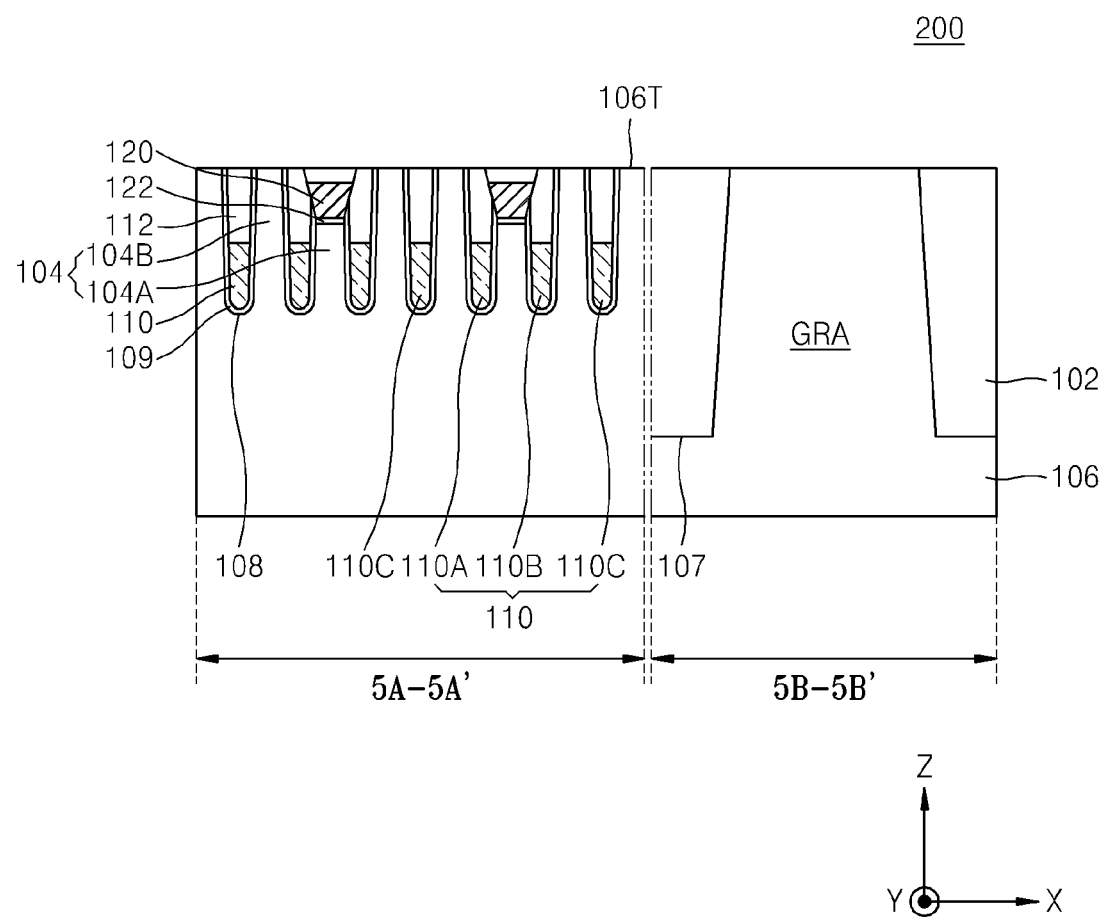

FIGS. 5A and 5B are top and cross-sectional views of a magnetic memory device 200 according to one or more embodiments of the present inventive concepts. FIG. 5A is a schematic top view illustrating primary components of the magnetic memory device 200, and FIG. 5B provides somewhat schematic partial cross-sectional views taken along line 5A-5A' and line 5B-5B' of FIG. 5A. Like reference numerals denote like elements, and redundant description thereof will be omitted for conciseness.

Referring to FIGS. 5A and 5B, the magnetic memory device 200 includes a cell array region CA, a core region or peripheral circuit region (hereinafter, referred to as "peripheral circuit region") PC around the cell array region CA, and a guard ring active region GRA surrounding the cell array region CA between the cell array region CA and the peripheral circuit region PC.

Although FIG. 5A shows only the plurality of word lines 110, the plurality of source lines 120, and the plurality of bit lines 160 in the cell array region CA, the cell array region CA of the magnetic memory device 200 may have almost the same configuration as described previously with respect to the magnetic memory device 100 shown in FIGS. 2 and 3. For conciseness, FIG. 5B shows only a partial configuration of the inside of the substrate 106.

The guard ring active region GRA is an active region formed on a boundary region between the cell array region CA and the peripheral circuit region PC. The guard ring active region GRA may be formed on a level that is the same as the plurality of active regions 104 (see FIGS. 2 and 3) defined on the substrate 106.

The plurality of source lines 120 may extend in a direction that crosses the plurality of bit lines 160 in the cell array region CA of the magnetic memory device 200. Each source line 120 may be arranged in a straight line along the Y-axis direction in the cell array region CA.

In the magnetic memory device 200, the plurality of source lines 120 are formed only in the cell array region CA and do not extend up to the guard ring active region GRA. In the guard ring active region GRA, a conductive layer formed on the same level as the plurality of source lines 120 and connected to the plurality of source lines 120 may not be formed.

The plurality of source lines 120 may be connected to a separate source connection line (not shown) via a contact CT1, and may be electrically connected to a transistor (not shown) formed in the peripheral circuit region PC via the contact CT1 and the source connection line.

The source connection line may be formed on a level that is different from a level at which the plurality of source lines 120 are formed, so as not to be arranged on the same plane as the plurality of source lines 120. The contact CT1 may be implemented by a contact plug extending on the substrate 106 in a Z-axis direction.

Figure 6A:
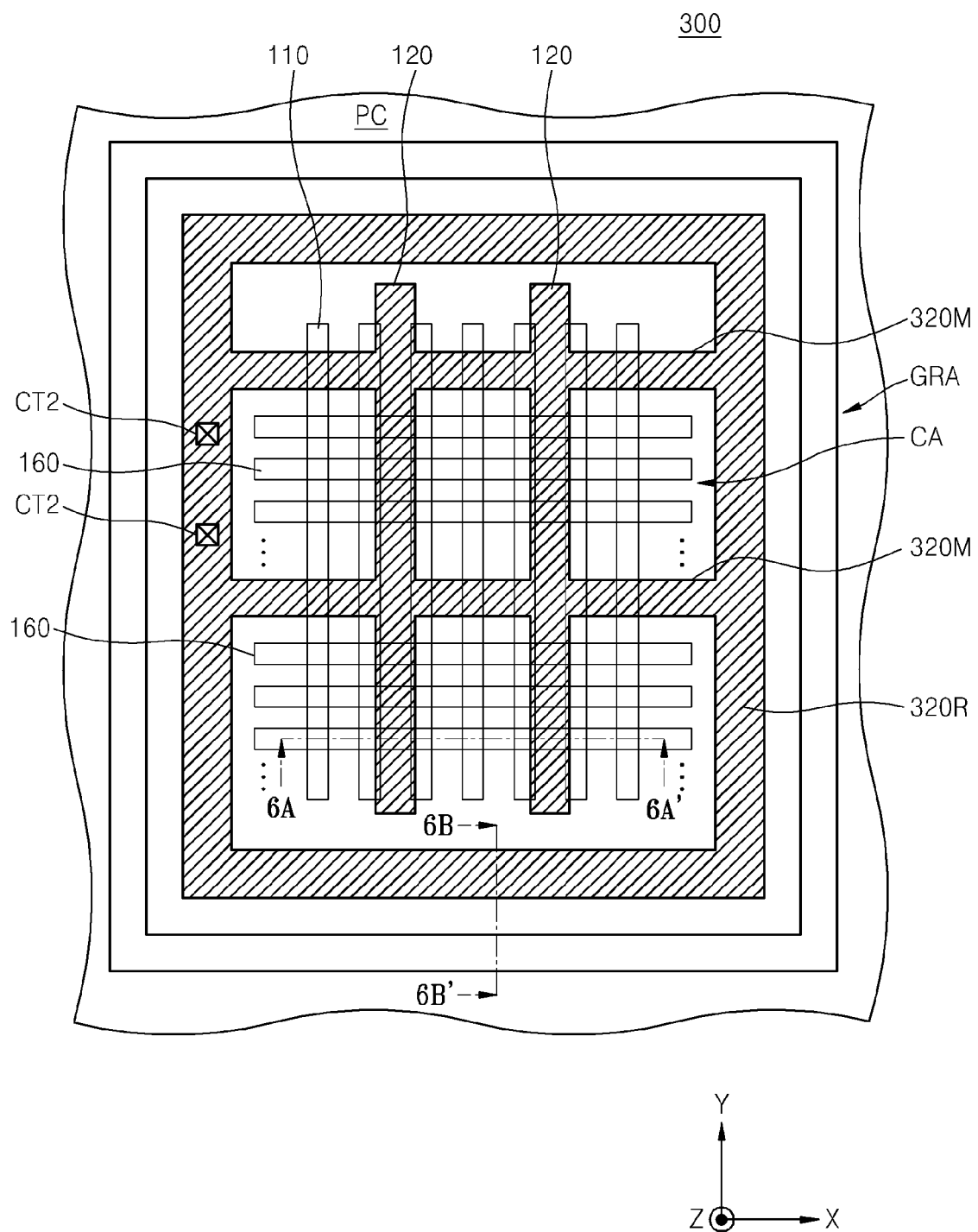
FIG. 6A is a schematic top view partially illustrating components of a magnetic memory device according to one or more embodiments of the present inventive concepts, and FIG. 6B provides somewhat schematic partial cross-sectional views taken along line 6A-6A' and line 6B-6B' of FIG. 6A.
Figure 6B:
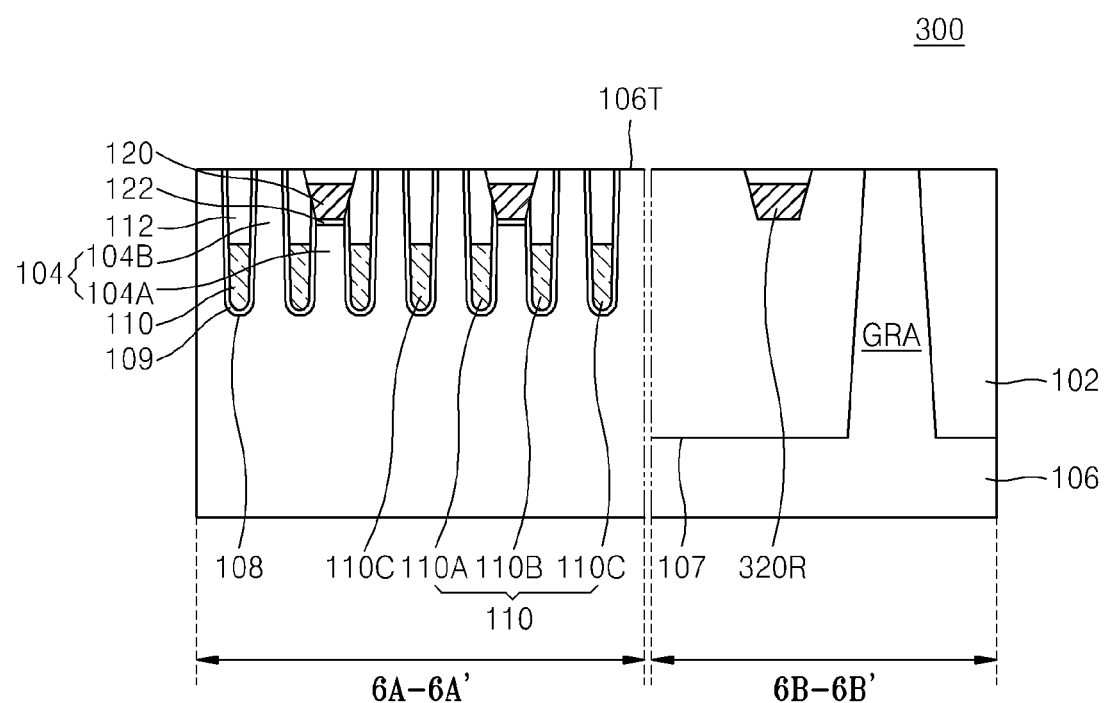

FIGS. 6A and 6B are provided to help describe a magnetic memory device 300 according to one or more embodiments of the present inventive concepts, wherein FIG. 6A is a schematic partial top view of components of the magnetic memory device 300, and FIG. 6B provides somewhat schematic cross-sectional views taken along line 6A-6A' and line 6B-6B' of FIG. 6A. Again, like reference numerals denote like elements of previous embodiments, and redundant description thereof will therefore be omitted.

Referring to FIGS. 6A and 6B, in the magnetic memory device 300, a plurality of mesh source lines 320M may be formed in the cell array region CA and extend across the plurality of source lines 120. An external source line 320R may be formed in a device isolation film 102 in the cell array region CA surrounded by the guard ring active region GRA. The external source line 320R may have a closed loop shape around the periphery of the cell array region CA, and may be arranged on a level that is lower than the upper surface 106T of the substrate 106.

According to one or more embodiments of the present inventive concepts, the plurality of mesh source lines 320M and the external source line 320R may be formed on the same plane as the plurality of source lines 120.

The plurality of source lines 120 may be connected to each other by the plurality of mesh source lines 320M and the external source line 320R. The plurality of mesh source lines 320M may be interposed between the plurality of source lines 120 and the external source line 320R to connect them to each other.

In the magnetic memory device 300, the plurality of source lines 120, the plurality of mesh source lines 320M, and the external source line 320R may be formed only in the cell array region CA and may not extend up to the guard ring active region GRA. The plurality of source lines 120 may be connected to a separate source connection line (not shown) via a contact CT2 formed on the external source line 320R, and may be electrically connected to a transistor (not shown) formed in the peripheral circuit region PC via the contact CT2 and the source connection line.

The source connection line may be formed on a level that is different from a level on which the plurality of source lines 120 are formed, so as not to be arranged on the same plane as the plurality of source lines 120. The contact CT2 may be implemented by a contact plug extending on the substrate 106 in the Z-axis direction.

As shown in FIGS. 6A and 6B, using the magnetic memory device 300 which includes the plurality of mesh source lines 320M and the external source line 320R connected to the plurality of source lines 120, even when the plurality of source lines 120 are formed with a relatively thin structure, a resistance in a source line may be reduced. In addition, by forming the plurality of source lines 120 on a level that is lower than the upper surface 106T of the substrate 106, the height of the plurality of buried contact plugs 140 may be lowered. Accordingly, a process margin may be easily secured when the plurality of buried contact plugs 140 are formed in high density.

Figure 7A:
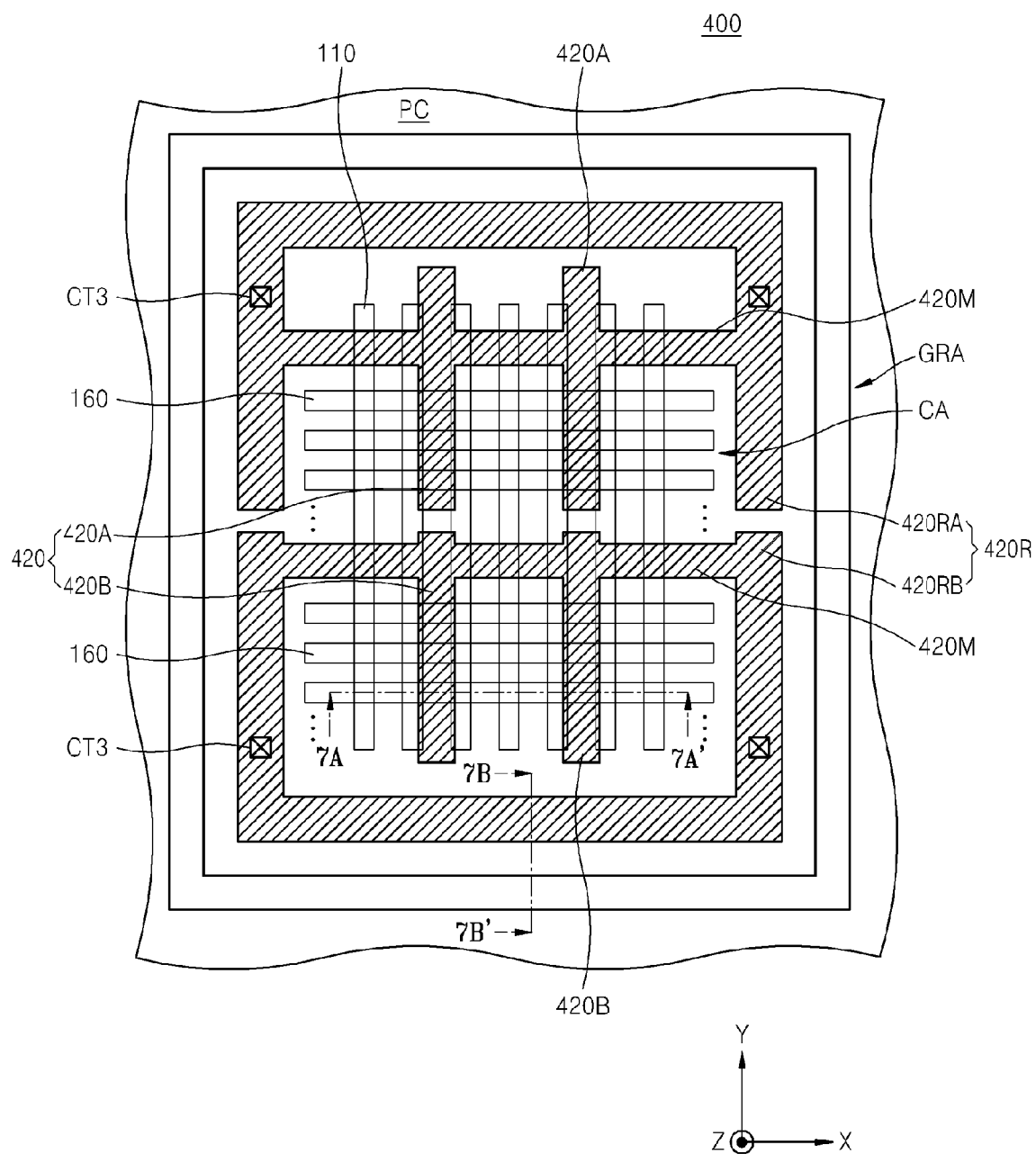
FIG. 7A is a schematic top view partially illustrating components of a magnetic memory device according to one or more embodiments of the present inventive concepts, and FIG. 7B provides somewhat schematic partial cross-sectional views taken along line 7A-7A' and line 7B-7B' of FIG. 7A.
Figure 7B:
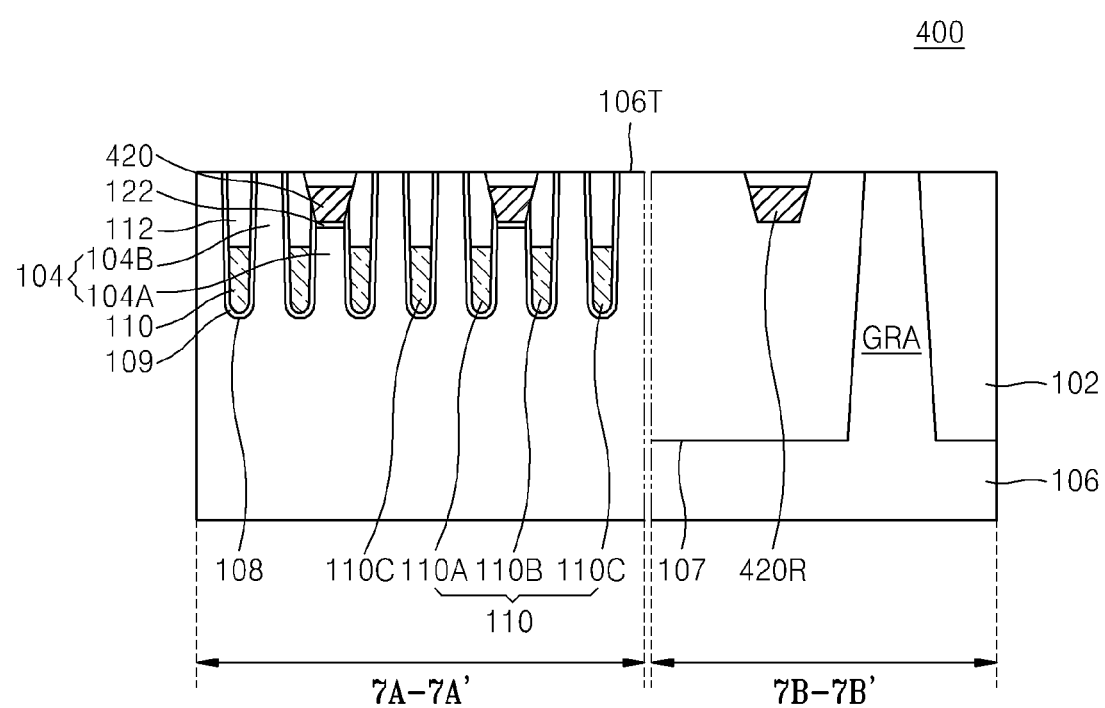

FIGS. 7A and 7B are provide to help describe a magnetic memory device 400 according to one or more embodiments of the present inventive concepts, wherein FIG. 7A is a schematic partial top view of components of the magnetic memory device 400, and FIG. 7B provides somewhat schematic cross-sectional views taken along line 7A-7A' and line 7B-7B' of FIG. 7A. Again, like reference numerals denote like elements of previous embodiments, and redundant description thereof will be omitted.

Referring to FIGS. 7A and 7B, in the magnetic memory device 400, a plurality of source lines 420 may be formed in the cell array region CA and may extend parallel to the word lines 110. However, the plurality of source lines 420 may include a plurality of first source line sections 420A and a plurality of separate second source line sections 420B spaced apart from the first source line sections 420A, wherein corresponding ones of the first and second source line sections 42A and 420B are arranged in a straight line along the Y-axis direction.

A plurality of mesh source lines 420M may extend along the X-axis direction to cross respective ones of the plurality of first source line sections 420A and the plurality of second source line sections 420B. The plurality of mesh source lines 420M may be formed on the same plane as the plurality of first source line sections 420A and the plurality of second source line sections 420B.

An external source line 420R may be formed in the cell array region CA surrounded by the guard ring active region GRA. The external source line 420R may be arranged on a level that is lower than the upper surface 106T of the substrate 106.

The external source line 420R may include a first external source line section 420RA and a second external source line section 420RB that are spaced apart from each other.

The plurality of first source line sections 420A are connected to only the first external source line section 420RA via corresponding partial mesh source lines 420M. The plurality of second source line sections 420B are connected to only the second external source line section 420RB via corresponding partial mesh source lines 420M.

According to one or more embodiments of the present inventive concepts, the plurality of mesh source lines 420M may be formed such that each one of the mesh source lines 420M corresponds to one bit line unit when a predetermined number of bit lines 160 are bundled together as one bit line unit. The plurality of first source line sections 420A may be formed to extend across one bit line unit. Similarly, the plurality of second source line sections 420B may be formed to extend across another bit line unit.

For example, one bit line unit may include eight or sixteen bit lines, but the present inventive concepts are not limited thereto.

In FIG. 7A, the plurality of first source line sections 420A are connected to each other by one mesh source line 420M and one first external source line section 420RA, and the plurality of second source line sections 420B are connected to each other by another mesh source line 420M and one second external source line section 420RB. However, the present inventive concepts are not limited thereto.

According to one or more embodiments of the present inventive concepts, the first external source line section 420RA, the second external source line section 420RB, the plurality of mesh source lines 420M, the plurality of first source line sections 420A, and the plurality of second source line sections 420B may all be formed on a single plane.

In the magnetic memory device 400, the plurality of first source line sections 420A, the plurality of second source line sections 420B, the plurality of mesh source lines 420M, the first external source line section 420RA, and the second external source line section 420RB are formed only in the cell array region CA, and do not extend into the guard ring active region GRA. The plurality of first source line sections 420A may be connected to a separate source connection line (not shown) via a contact CT3 formed on the first external source line section 420RA, and may be electrically connected to a transistor (not shown) formed in the peripheral circuit region PC via the contact CT3 and the source connection line. Similarly, the plurality of second source line sections 420B may be connected to a separate source connection line (not shown) via a contact CT3 formed on the second external source line section 420RB, and may be electrically connected to a transistor (not shown) formed in the peripheral circuit region PC via the contact CT3 and the source connection line.

The source connection line may be formed on a level that is different from a level on which the plurality of first source line sections 420A and the plurality of second source line sections 420B are formed, so as not to be arranged on the same plane as the plurality of source lines 420. The contact CT3 may be implemented using a contact plug that extends on the substrate 106 in the Z-axis direction.

As shown in FIGS. 7A and 7B, using the magnetic memory device 400 which includes the plurality of mesh source lines 420M, the first external source line section 420RA, and the second external source line section 420RB connected to the plurality of first source line sections 420A and the plurality of second source line sections 420B, even when the plurality of first source line sections 420A and the plurality of second source line sections 420B are formed having a relatively thin structure, a resistance in the source line may be reduced. In addition, by forming the plurality of first source line sections 420A and the plurality of second source line sections 420B on a level that is lower than the upper surface 106T of the substrate 106, the height of the plurality of buried contact plugs 140 may be lowered. Accordingly, a process margin may be easily secured when the plurality of buried contact plugs 140 are formed in high density.

FIGS. 8A to 19B are schematic top views and somewhat schematic cross-sectional views of a magnetic memory device 500 (see FIGS. 19A and 19B) being constructed according to a method of manufacturing a magnetic memory device 500 according to one or more embodiments of the present inventive concepts.

Figure 8A:
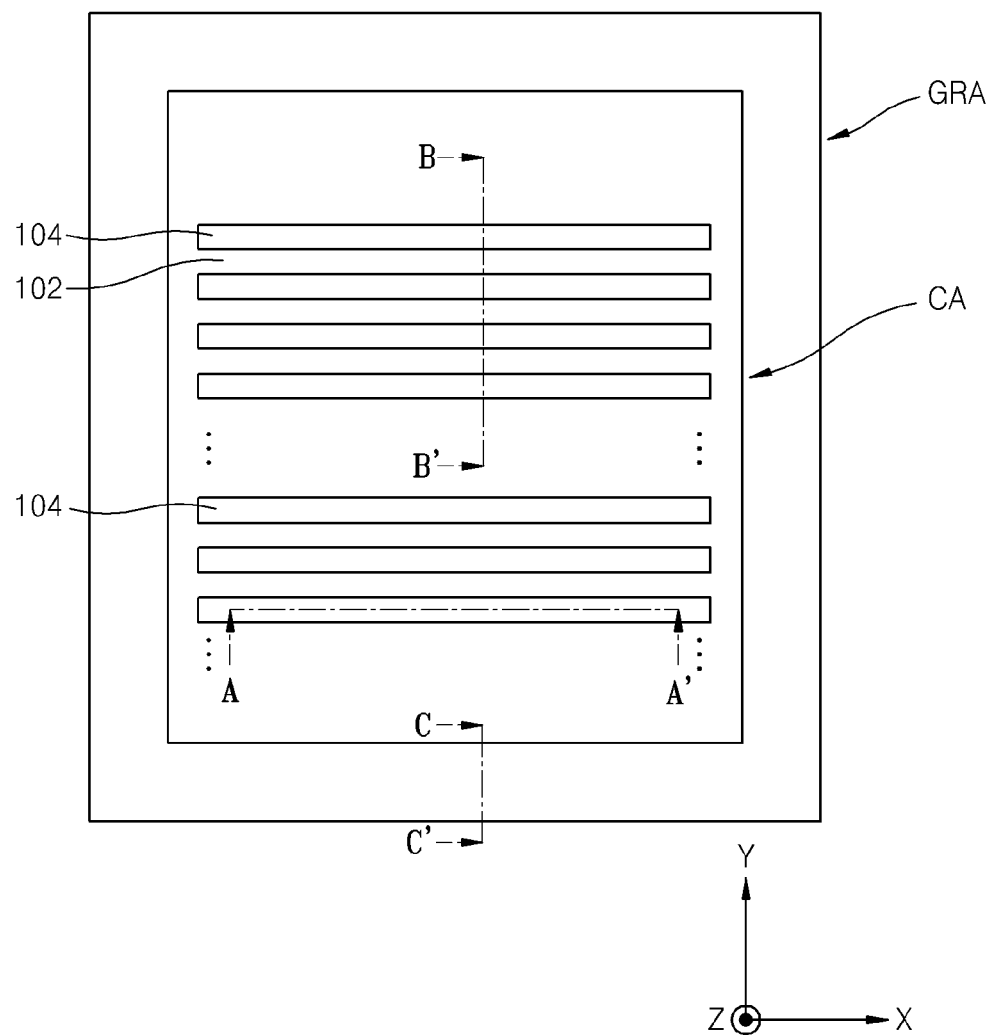
FIGS. 8A to 19B are schematic top views and somewhat schematic cross-sectional views of a magnetic memory device being constructed according to a method of manufacturing a magnetic memory device, illustrating a process order for manufacturing a magnetic memory device according to one or more embodiments of the present inventive concepts.
Figure 8B:
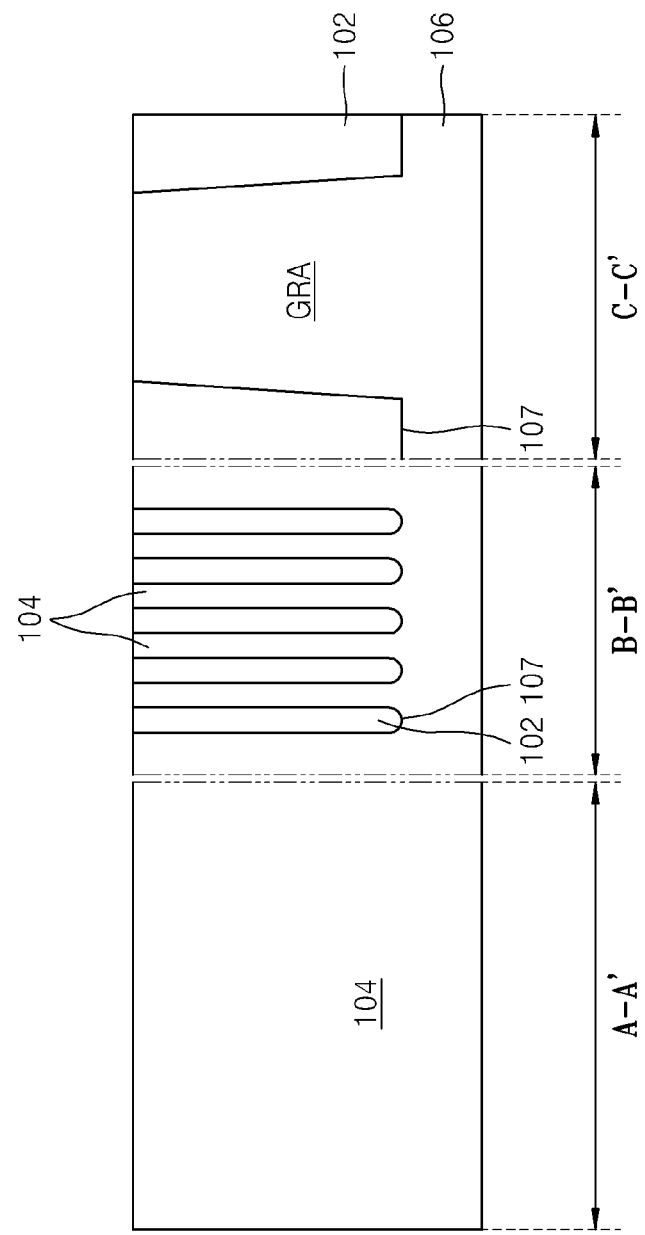
Figure 9A:
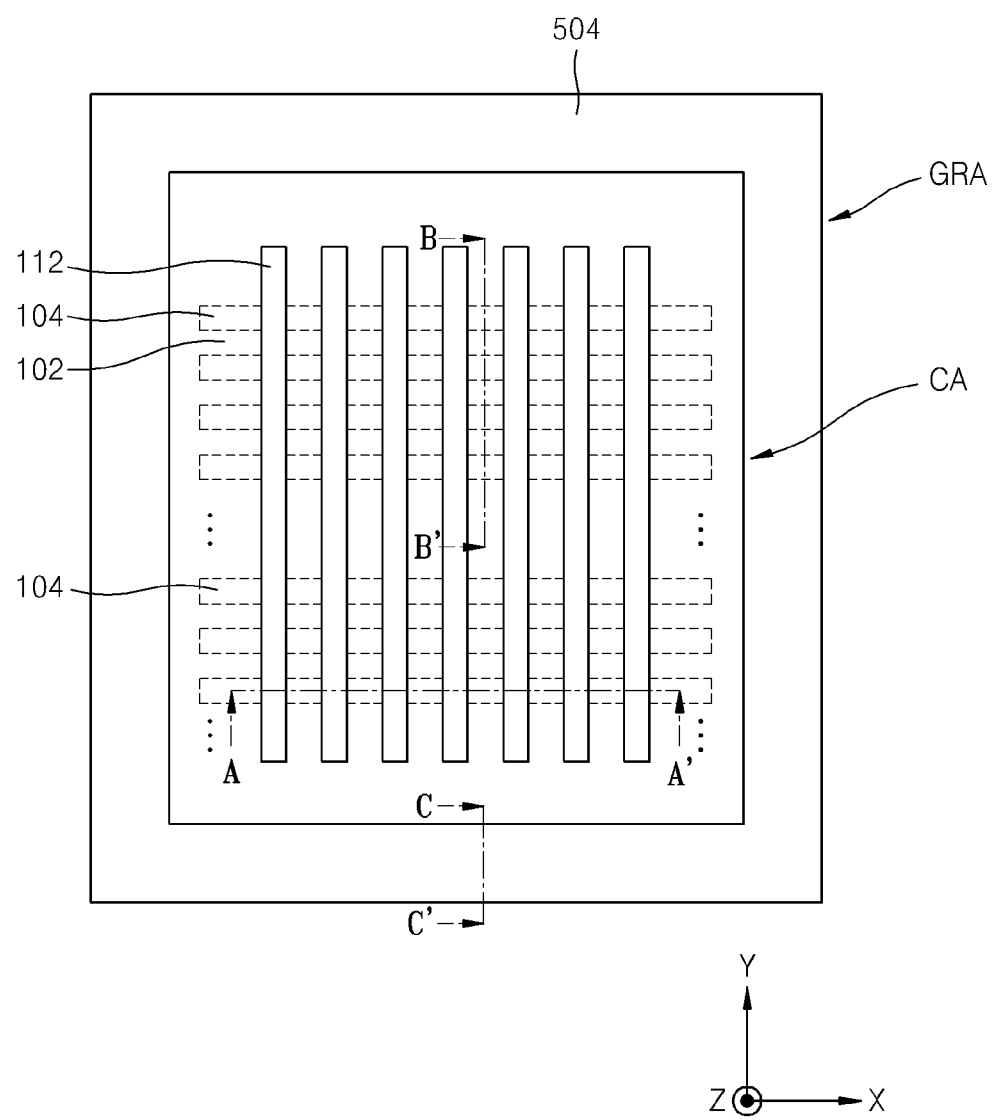
Figure 9B:
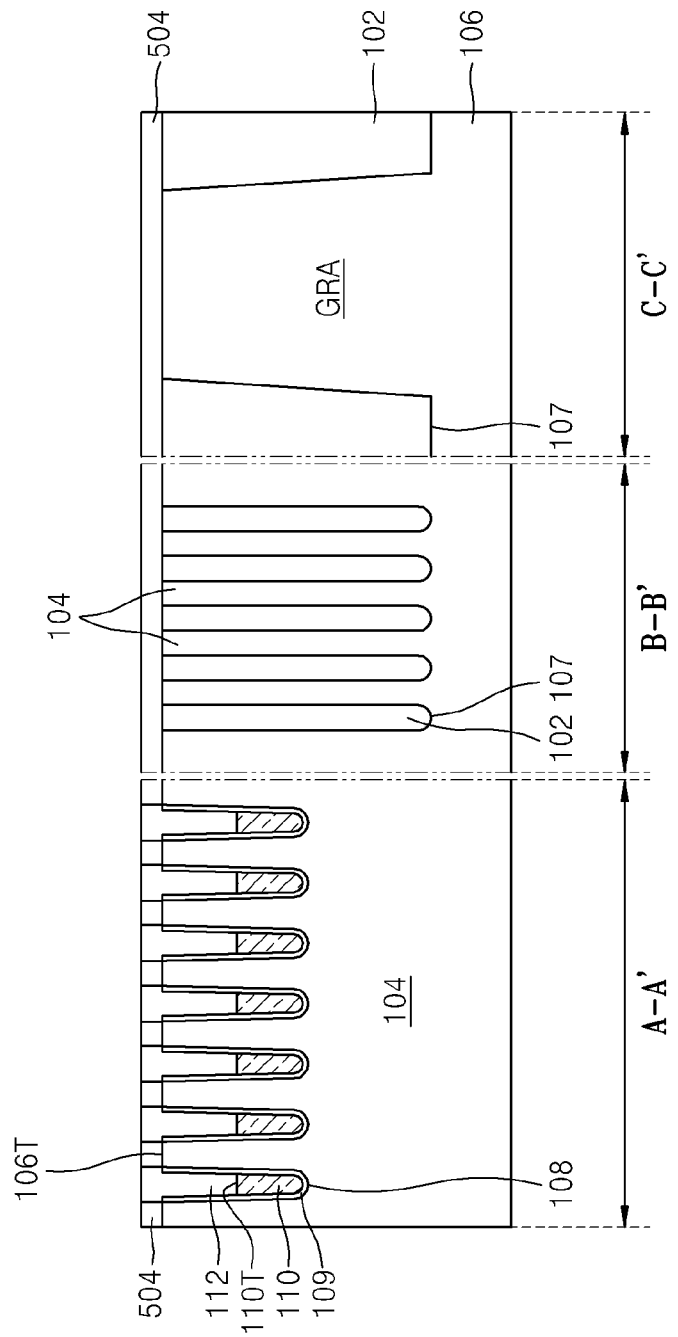

FIGS. 8A, 9A, . . . , and 19A are schematic top views of components in the cell array region CA, the peripheral circuit region PC, and the guard ring active region GRA arranged therebetween in the magnetic memory device 500. FIGS. 8B, 9B, . . . , and 19B provide somewhat schematic cross-sectional views taken along line A-A', line B-B', and line C-C' of the corresponding FIGS. 8A, 9A, . . . , and 19A, respectively.

A method of manufacturing the magnetic memory device 500 having a configuration in which the plurality of source lines 120 are formed only in the cell array region CA, similar to the magnetic memory device 200 of FIGS. 5A and 5B, will now be described with reference to FIGS. 8A to 19B. Like reference numerals denote like elements to previous embodiments, and redundant description thereof will be omitted.

Referring to FIGS. 8A and 8B, a device isolation trench 107 may be formed in the substrate 106, and the device isolation film 102 may be formed in the device isolation trench 107. The plurality of active regions 104 are defined in the cell array region CA of the substrate 106 by the device isolation film 102, and the guard ring active region GRA is defined around the cell array region CA.

The device isolation film 102 may be any of an oxide film, a nitride film, or a combination thereof. According to one or more embodiments of the present inventive concepts, the device isolation film 102 may be a single layer structure including one type of insulation film or it may be a multi-layer structure including at least two types of insulation films.

Referring to FIGS. 9A and 9B, a mask pattern 504 may be formed on the substrate 106 using a photolithography process, and the plurality of gate trenches 108 may be formed in the substrate 106 by using the mask pattern 504 as an etching mask.

According to one or more embodiments of the present inventive concepts, the mask pattern 504 may be any of an oxide film, a nitride film, or a combination thereof, but is not limited thereto.

The plurality of gate trenches 108 may extend parallel to each other along the Y-axis direction, and each of the plurality of gate trenches 108 may have a line shape that crosses the plurality of active regions. According to one or more embodiments of the present inventive concepts, the plurality of gate trenches 108 may have level differences from each other at the lower surfaces thereof. For example, level differences of the lower surfaces of the plurality of gate trenches 108 may be achieved by forming the plurality of gate trenches 108 to have lower surfaces of different levels on the device isolation film 102 and the plurality of active regions 104. To form the plurality of gate trenches 108 having the level differences at the lower surfaces thereof, the device isolation film 102 and the substrate 106 may be etched through respective etching processes to thereby cause an etching depth of the device isolation film 102 to be different from an etching depth of the substrate 106.

After cleaning an intermediate product in which the plurality of gate trenches 108 are formed, the plurality of gate dielectric films 109, the plurality of word lines 110, and the plurality of buried insulation films 112 may be sequentially formed in the plurality of gate trenches 108.

According to one or more embodiments of the present inventive concepts, after forming the plurality of word lines 110, impurity ions may be injected into the plurality of active regions 104 of the substrate 106 at both sides of the plurality of word lines 110 to thereby form a source/drain region on the upper surface of each of the plurality of active regions 104. According to other one or more embodiments of the present inventive concepts, before forming the plurality of word lines 110, an impurity ion injection process may be performed to form source/drain regions. According to one or more embodiments of the present inventive concepts, during, before, or after forming a source/drain region on the upper surface of each of the plurality of active regions 104, impurity ions may be injected into the guard ring active region (GRA).

An upper surface 110T of each of the plurality of word lines 110 may be located on a level that is lower than the upper surface 106T of the substrate 106. The lower surfaces of the plurality of word lines 110 may have an uneven shape, and a saddle fin-shaped field effect transistor (FinFET) may be formed in the plurality of active regions 104. According to one or more embodiments of the present inventive concepts, the plurality of word lines 110 may be formed of at least one material selected from the group including Ti, TiN, Ta, TaN, W, WN, TiSiN, and WSiN, but the inventive concepts are not limited thereto.

The plurality of gate dielectric films 109 may include at least one material selected from the group including a silicon oxide film, a silicon nitride film, a silicon oxynitride film, an ONO, and a high-k dielectric film having a higher dielectric constant than the silicon oxide film. For example, each of the plurality of gate dielectric films 109 may have a dielectric constant of about 10 to about 25. According to one or more embodiments of the present inventive concepts, the plurality of gate dielectric films 109 may include at least one material selected from the group including a hafnium oxide (HfO), a hafnium silicate (HfSiO), a hafnium oxynitride (HfON), a hafnium silicon oxynitride (HfSiON), a lanthanum oxide (LaO), a lanthanum aluminum oxide (LaAlO), a zirconium oxide (ZrO), a zirconium silicate (ZrSiO), a zirconium oxynitride (ZrON), a zirconium silicon oxynitride (ZrSiON), a tantalum oxide (TaO), a titanium oxide (TiO), a barium strontium titanium oxide (BaSrTiO), a barium titanium oxide (BaTiO), a strontium titanium oxide (SrTiO), a yttrium oxide (YO), an aluminum oxide (AlO), and a lead scandium tantalum oxide (PbScTaO). For example, the plurality of gate dielectric films 109 may be formed of $HfO_2$, $Al_2O_3$, $HfAlO_3$, $Ta_2O_3$, or $TiO_2$.

The plurality of buried insulation films 112 may be formed of a silicon oxide film, a silicon nitride, a silicon oxynitride, or a combination thereof.

Figure 10A:
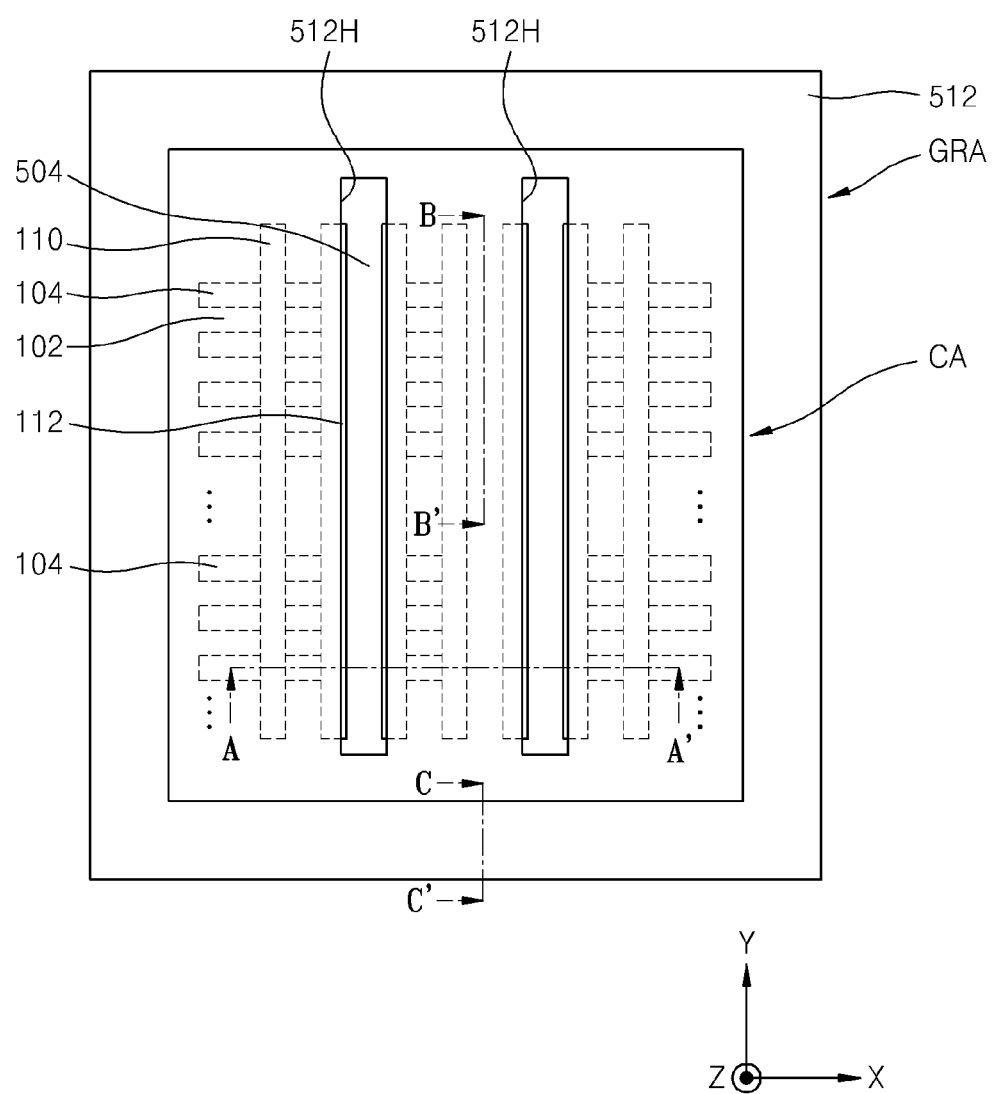
Figure 10B:
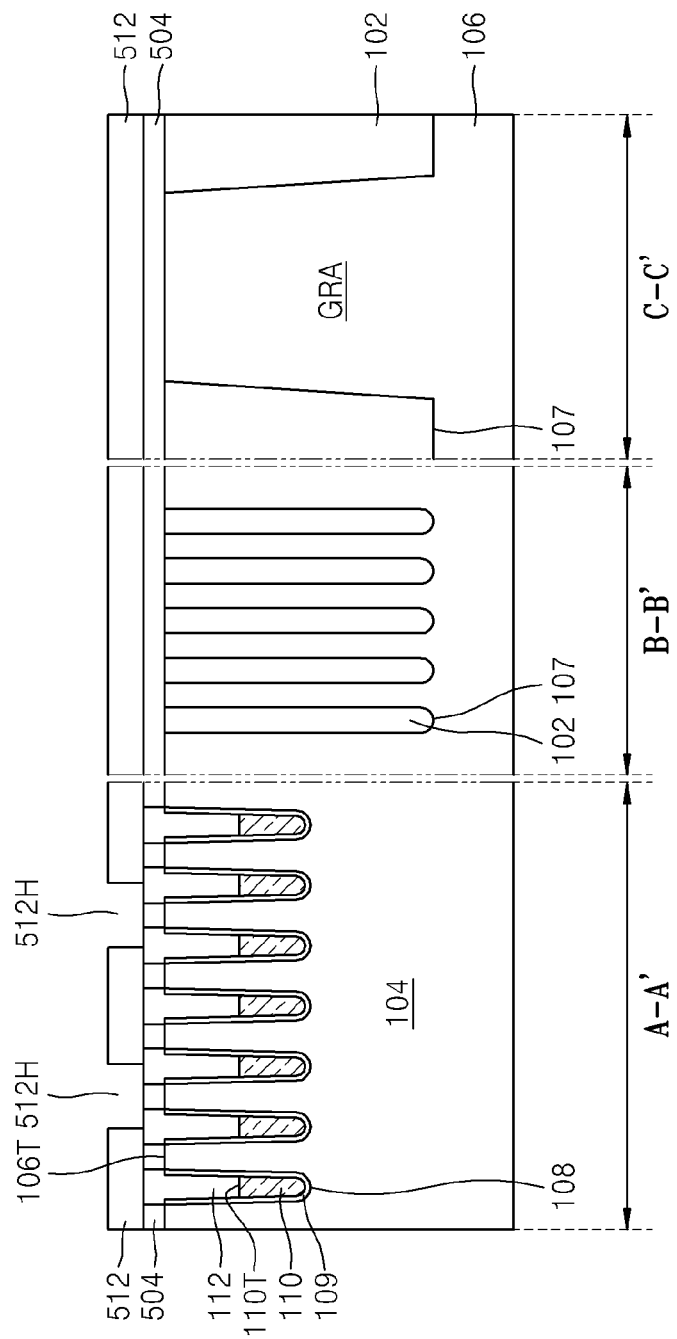

Referring to FIGS. 10A and 10B, a mask pattern 512 may be formed on an intermediate product having the plurality of buried insulation films 112 formed therein. The mask pattern 512 may be formed having a plurality of openings 512H that expose an upper surface of a region in which the plurality of source lines 120 (see FIGS. 12A and 12B) are to be formed.

According to one or more embodiments of the present inventive concepts, the mask pattern 512 may be a photoresist material.

Figure 11A:
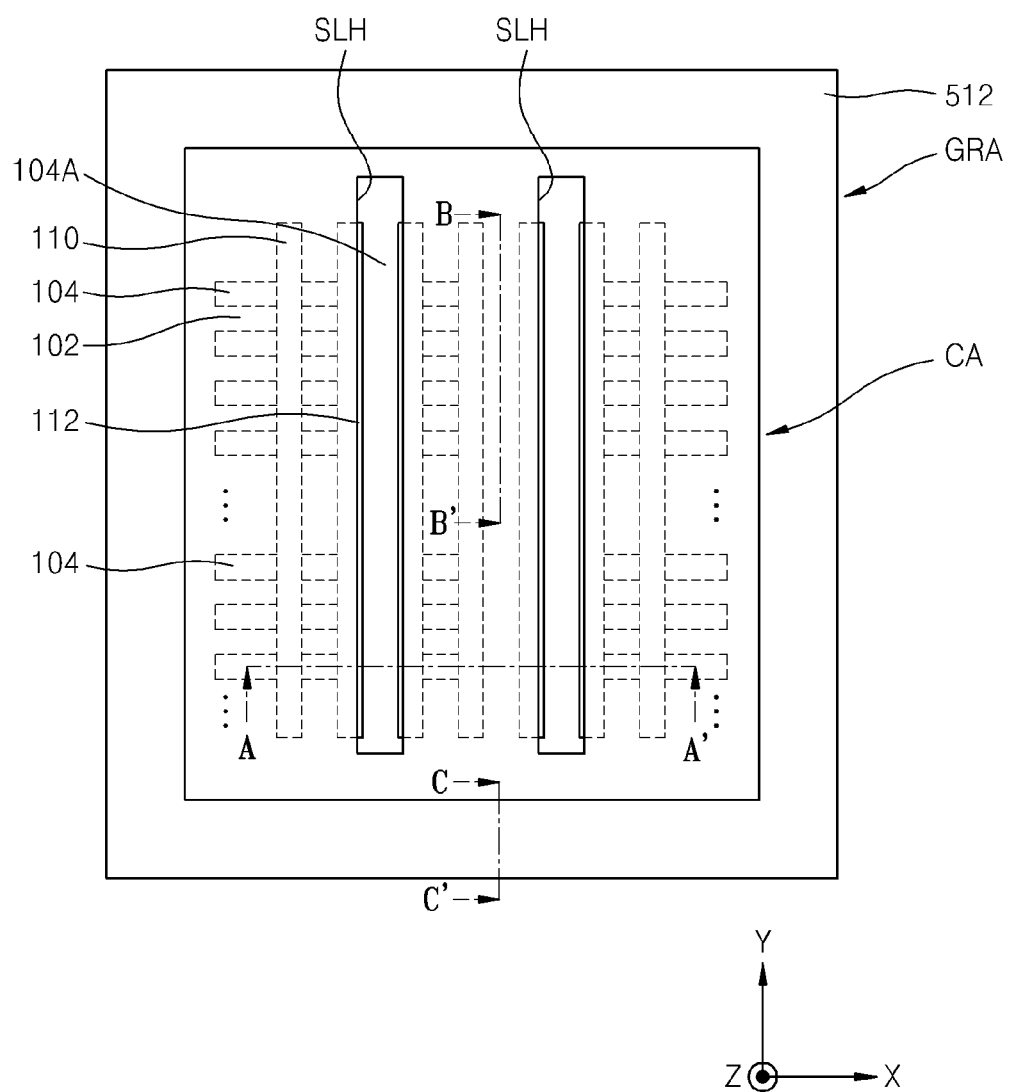
Figure 11B:
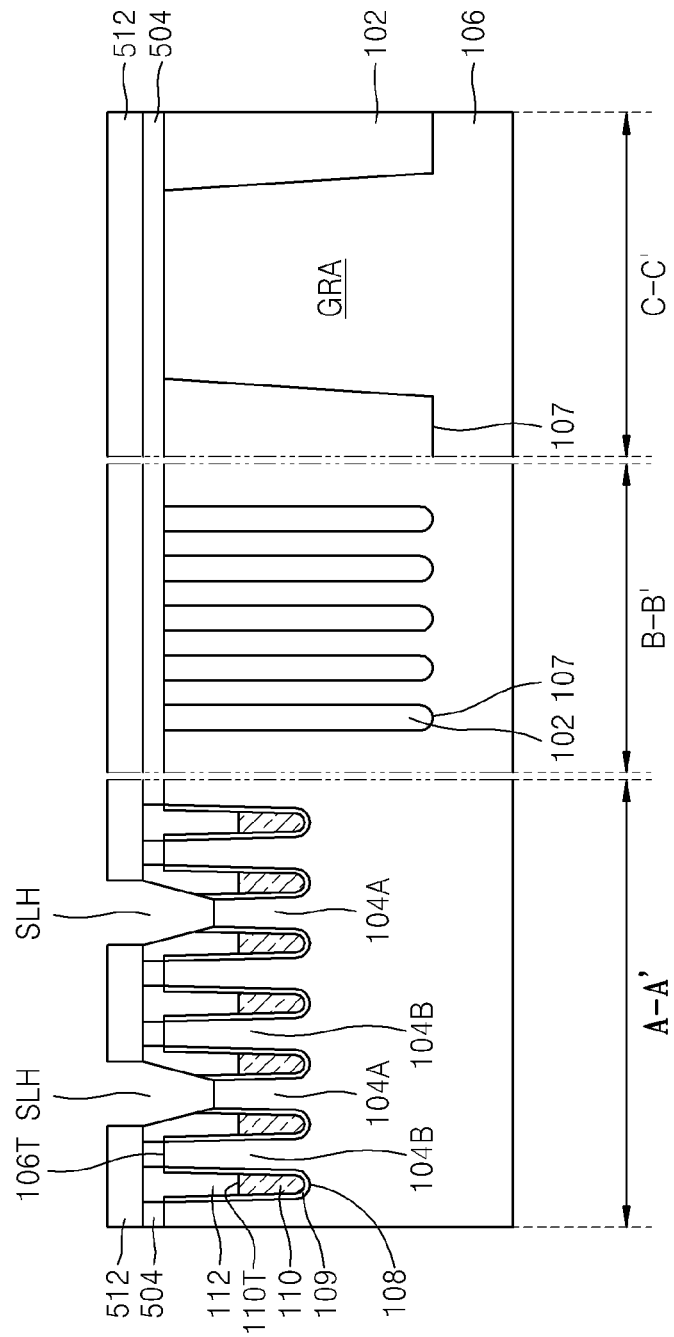

Referring to FIGS. 11A and 11B, a plurality of source line holes SLH are formed to expose the upper surfaces of the plurality of first active regions 104A. The source line holes SLH are formed using the mask pattern 512 as an etching mask by etching the plurality of active regions 104, the plurality of buried insulation films 112, and the plurality of gate dielectric films 109 interposed therebetween, which are exposed through the plurality of openings 512H.

The upper surfaces of the plurality of first active regions 104A that are exposed at the lower surfaces of the plurality of source line holes SLH are located on a level that is higher than the upper surfaces 110T of the plurality of word lines 110. To secure a sufficient insulation distance for the plurality of buried insulation films 112 between the plurality of source line holes SLH and adjacent word lines 110, the plurality of source line holes SLH are formed so that the lower surfaces of the plurality of source line holes SLH are separated by at least the sufficient insulation distance from the upper surfaces 110T of adjacent word lines 110.

Although FIG. 11B shows that side walls of the plurality of source line holes SLH have a tapered shape, the present inventive concepts are not limited thereto. For example, the plurality of source line holes SLH may be formed to have substantially vertical side walls.

Figure 12A:
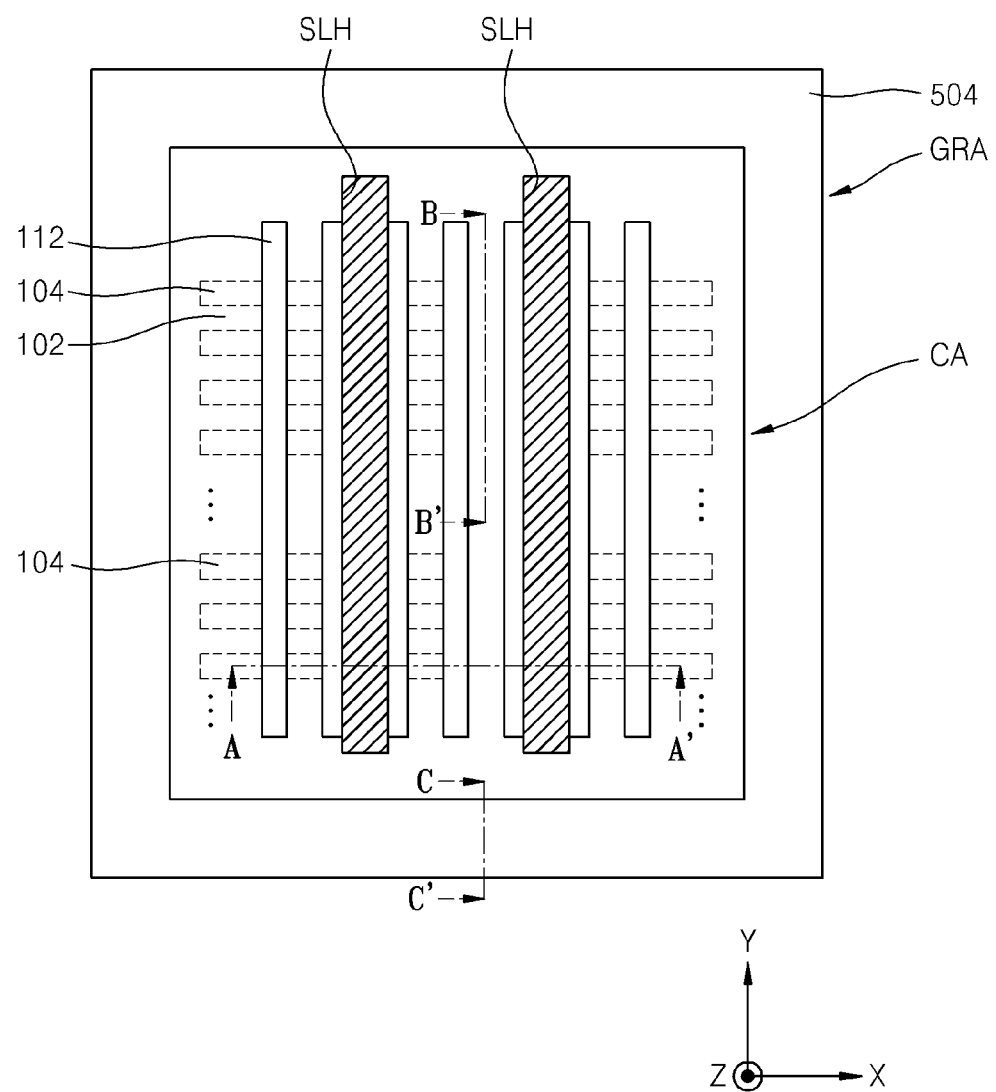
Figure 12B:
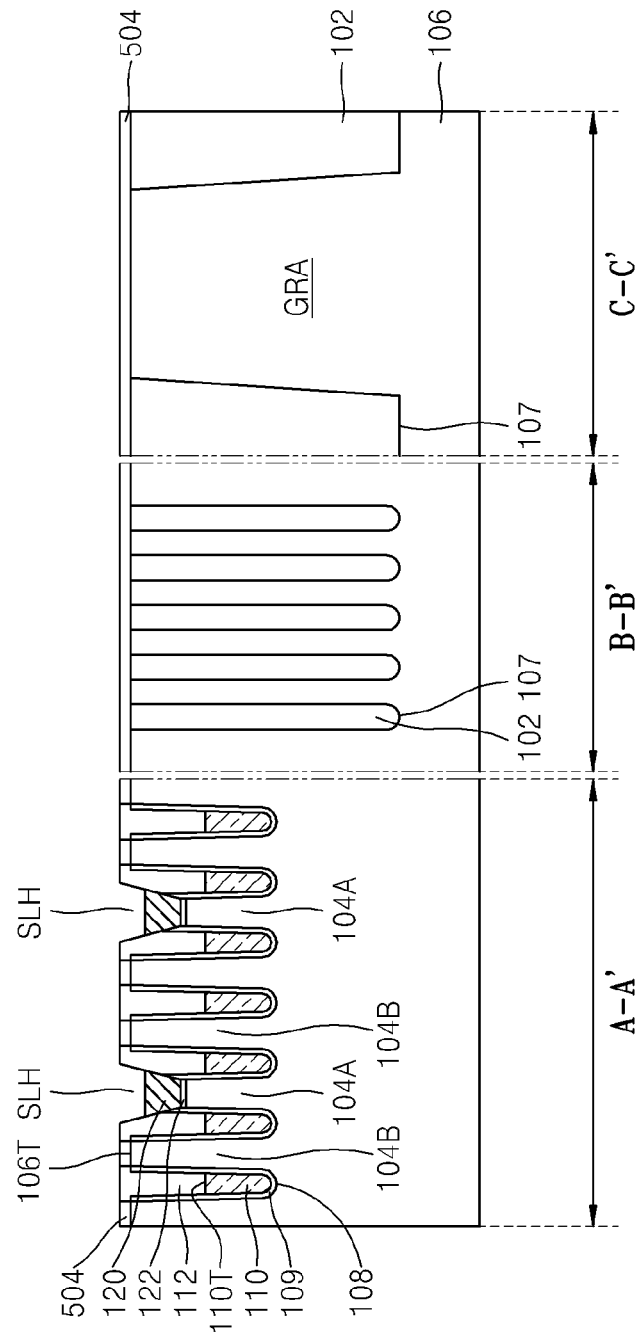

Referring to FIGS. 12A and 12B, after removing the mask pattern 512, the metal silicide film 122 may be formed on the upper surface of each of the plurality of first active regions 104A exposed through the plurality of source line holes SLH. Thereafter, the plurality of source lines 120 connected to the plurality of metal silicide films 122 in the plurality of source line holes SLH may be formed.

According to one or more embodiments of the present inventive concepts, the plurality of metal silicide films 122 may be formed of a cobalt silicide or a titanium silicide, but they are not limited thereto. The plurality of source lines 120 may include a metal, a conductive metal nitride, or a metal-semiconductor composite. For example, the plurality of source lines 120 may include a barrier film formed of TiN or WN and a metal film formed of W, but they are not limited thereto.

While forming the plurality of source lines 120, a portion of the plurality of buried insulation films 112 and the mask pattern 504 that remains around the plurality of source lines 120 may be consumed, and accordingly, after forming the plurality of source lines 120, the thickness of the plurality of buried insulation films 112 and the mask pattern 504 may be thinner than before.

Although the plurality of metal silicide films 122 and the plurality of source lines 120 have been described as being formed after removing the mask pattern 512 (FIGS. 11A and 11B), the present inventive concepts are not limited thereto. For example, the mask pattern 512 may be removed after forming the plurality of metal silicide films 122 and the plurality of source lines 120.

Figure 13A:
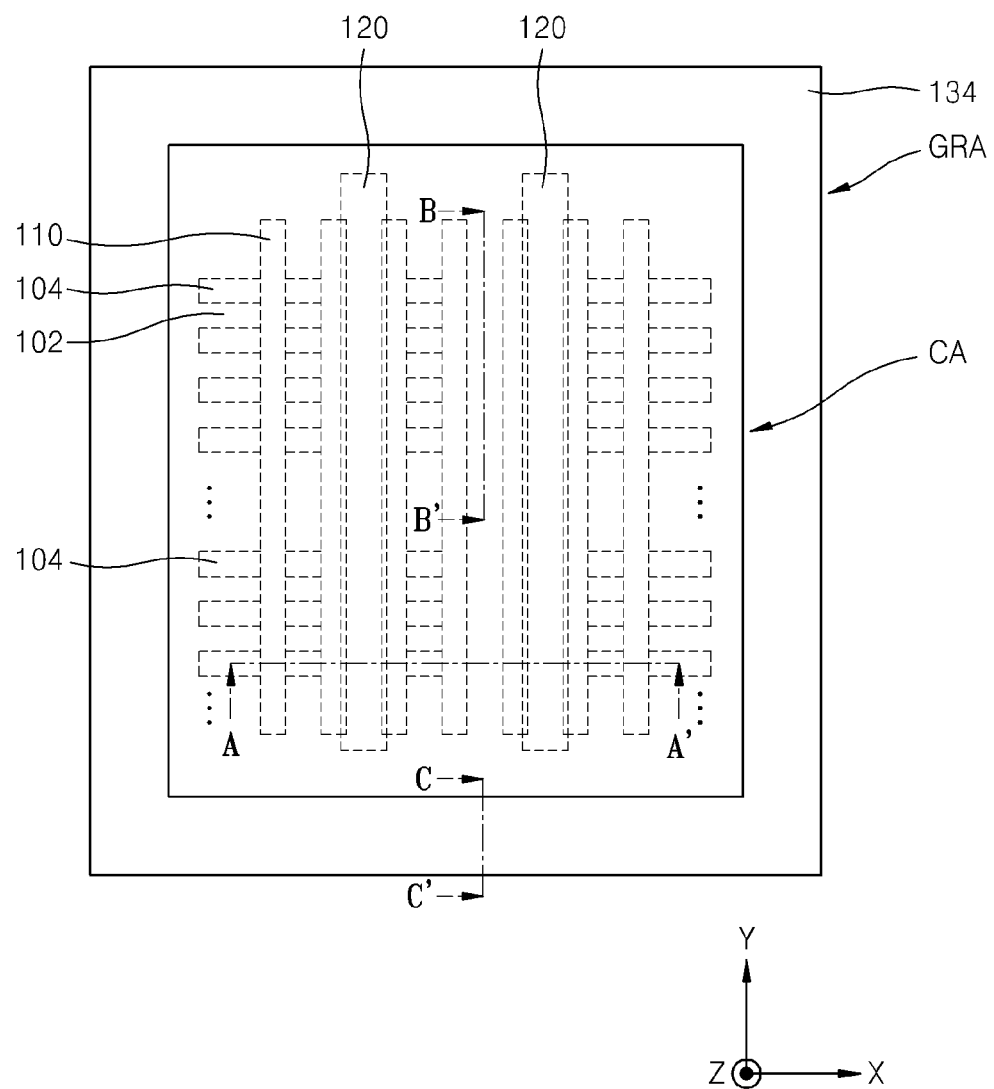
Figure 13B:
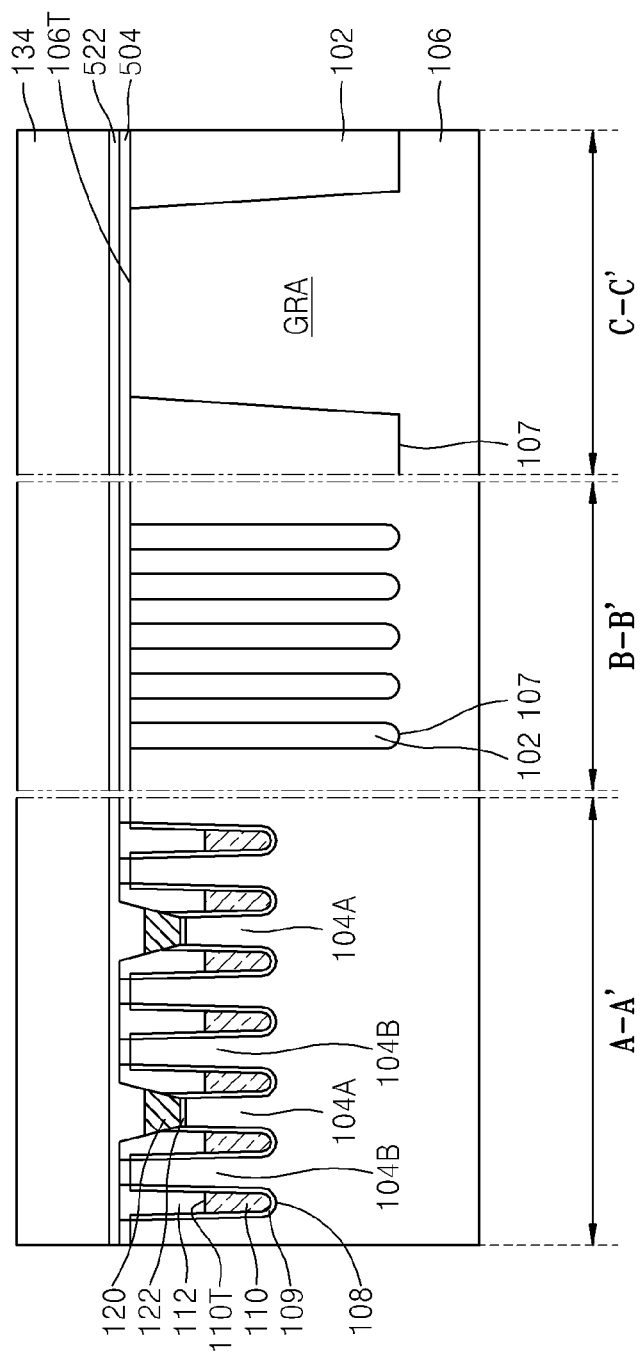

Referring to FIGS. 13A and 13B, a planarized second insulation film 134 may be formed on a buried insulation film 522 after forming the buried insulation film 522. The buried insulation film 522 may fill in a space of the plurality of source line holes SLH that remains above the plurality of source lines 120.

According to one or more embodiments of the present inventive concepts, a portion of the plurality of buried insulation films 112 that remains on the upper surface 106T of the substrate 106, the mask pattern 504 remaining on the substrate 106, and at least a portion of the buried insulation film 522 may correspond to the first insulation film 132 of FIG. 3.

Each of the buried insulation film 522 and the second insulation film 134 may be formed of an oxide film, a nitride film, or a combination thereof. According to one or more embodiments of the present inventive concepts, the buried insulation film 522 may be formed of a nitride film, and the second insulation film 134 may be formed of an oxide film. According to other one or more embodiments of the present inventive concepts, the buried insulation film 522 may be formed of the same material as that of the plurality of buried insulation films 112.

According to one or more embodiments of the present inventive concepts, the second insulation film 134 may be formed at the same time as an interlayer insulating film (not shown) covering a gate electrode (not shown) for a peripheral circuit in the peripheral circuit region PC is formed, after forming the gate electrode for a peripheral circuit.

Figure 14A:
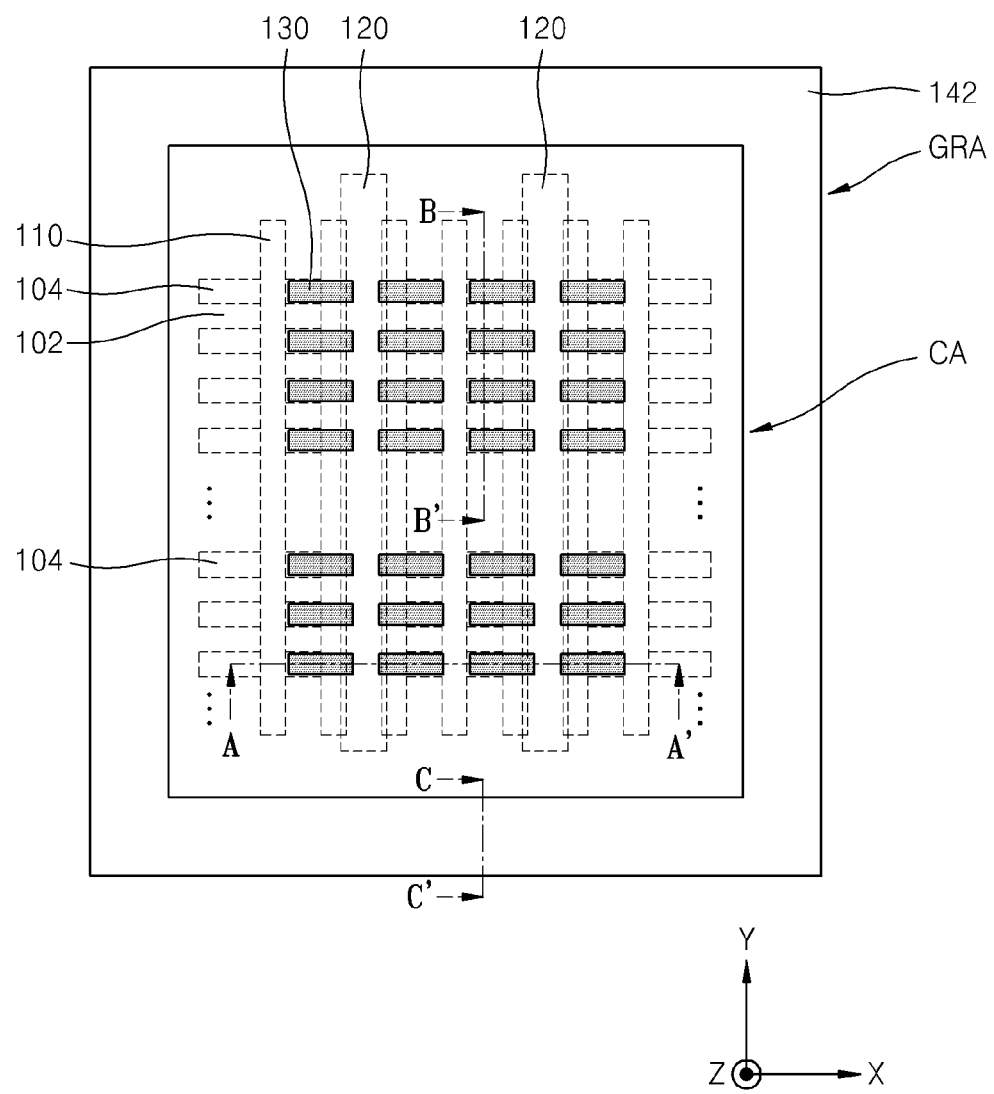
Figure 14B:
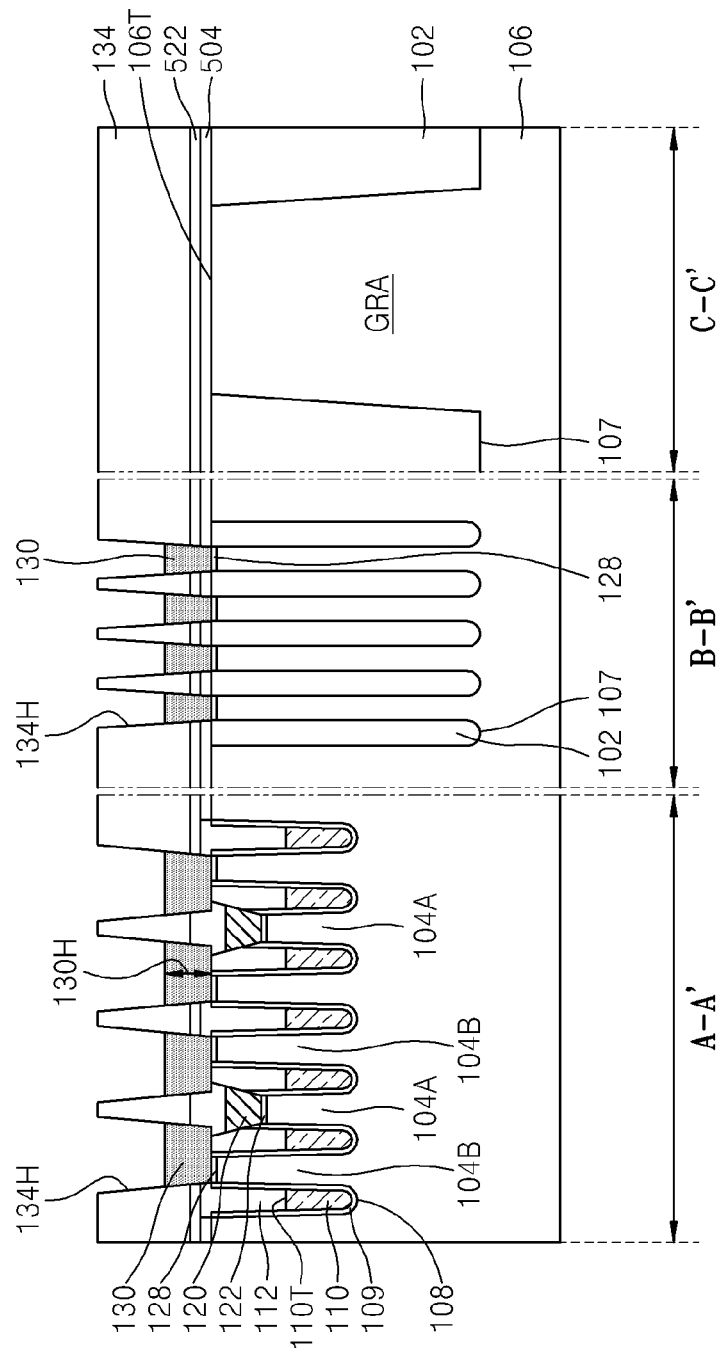

Referring to FIGS. 14A and 14B, a plurality of contact holes 134H, exposing the upper surfaces of the plurality of second active regions 104B, may be formed by etching a portion of the second insulation film 134 and sequentially etching the buried insulation film 522, the plurality of buried insulation films 112, and insulation films forming the mask pattern 504 that are exposed as a result of etching the portion of the second insulation film 134 using a mask pattern (not shown).

Thereafter, the metal silicide film 128 may be formed on each of the surfaces of the plurality of second active regions 104B exposed through the plurality of contact holes 134H. After forming a conductive layer for a contact pad that covers the plurality of metal silicide films 128 in the plurality of contact holes 134H and fills in the plurality of contact holes 134H, the plurality of contact pads 130 may be formed in the plurality of contact holes 134H by etching back the conductive layer. The plurality of contact pads 130 are thereby connected to the plurality of second active regions 104B via the plurality of metal silicide films 128. According to one or more embodiments of the present inventive concepts, to decrease a resistance in the plurality of contact pads 130, a process of injecting impurities into the plurality of contact pads 130 may be performed using an ion injection process, for instance.

According to one or more embodiments of the present inventive concepts, the plurality of metal silicide films 128 may be formed of a cobalt silicide or a titanium silicide, and the plurality of contact pads 130 may be formed of a doped polysilicon, but according to the present inventive concepts, the materials for forming the plurality of metal silicide films 128 and the plurality of contact pads 130 are not limited thereto.

A height 130H of the plurality of contact pads 130 may be controlled by an amount or depth which the conductive layer for a contact pad is removed by the etch back process. The greater the height 130H of the plurality of contact pads 130, the more an etching depth of contact holes may be reduced, and the more a height of the plurality of buried contact plugs 140 (to be formed in a subsequent process) may be reduced. Therefore, this process may be effective in securing a desired process margin in an etching process for forming the contact holes and a deposition process for forming the plurality of buried contact plugs 140.

Figure 15A:
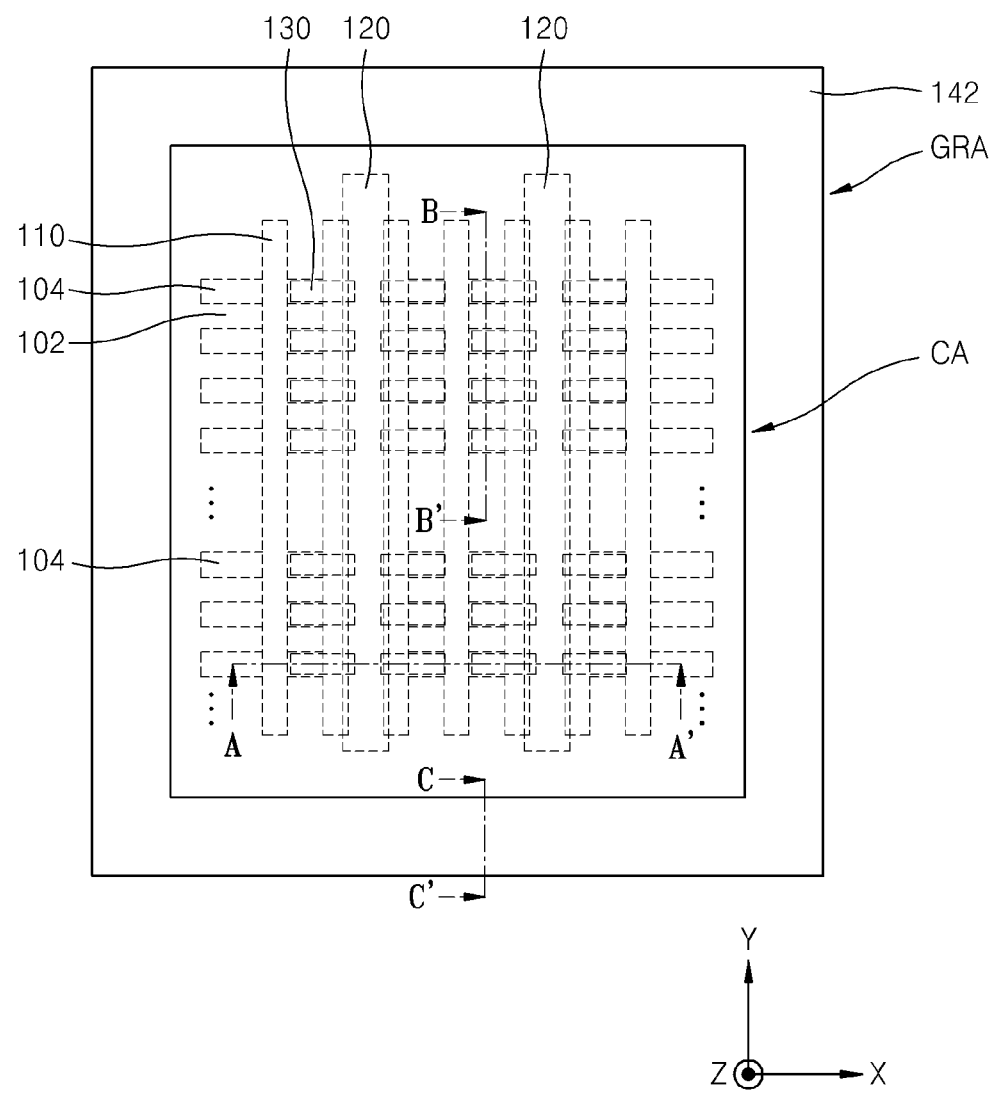
Figure 15B:
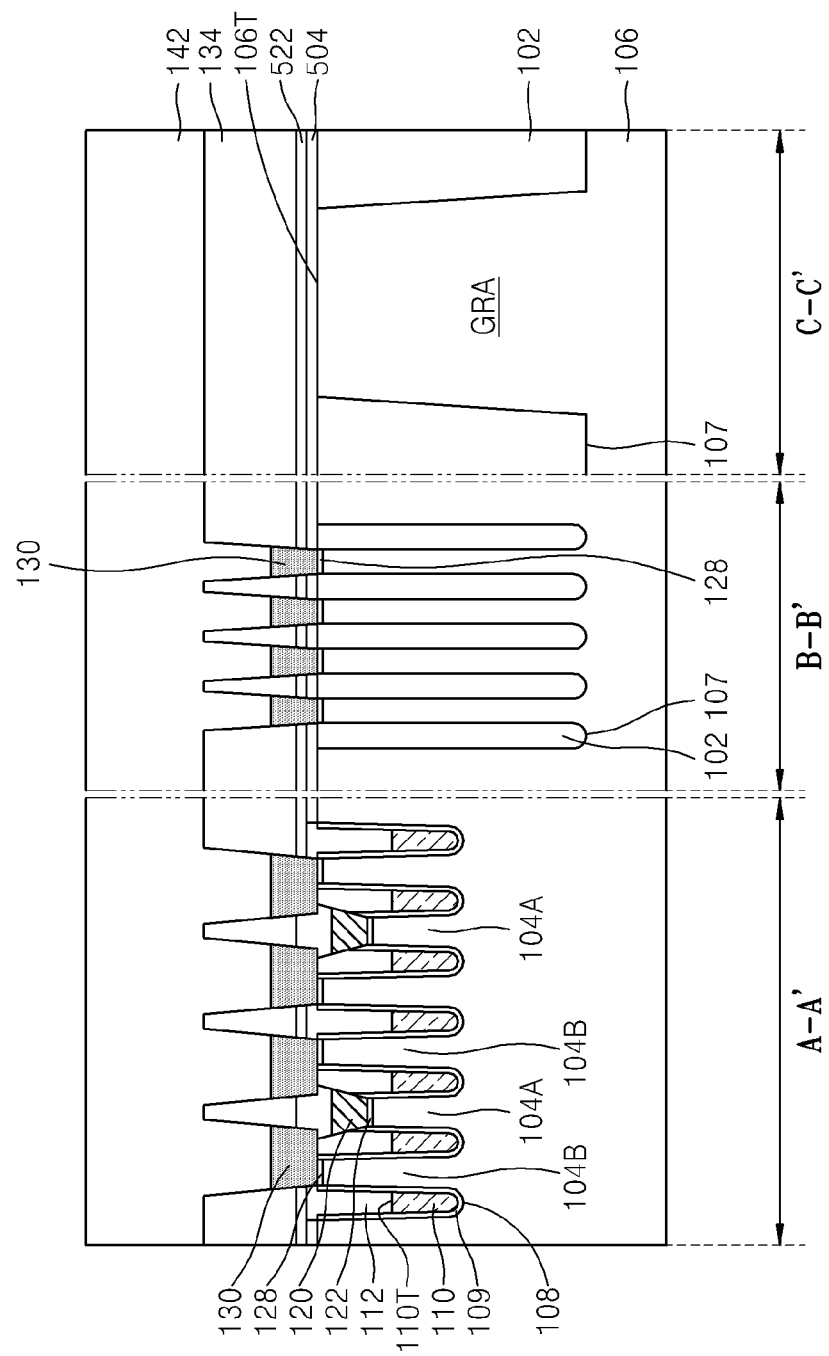

Referring to FIGS. 15A and 15B, the third insulation film 142 is formed on an intermediate product in which the plurality of contact pads 130 are formed.

The third insulation film 142 may be formed of an oxide film, a nitride film, or a combination thereof.

Figure 16A:
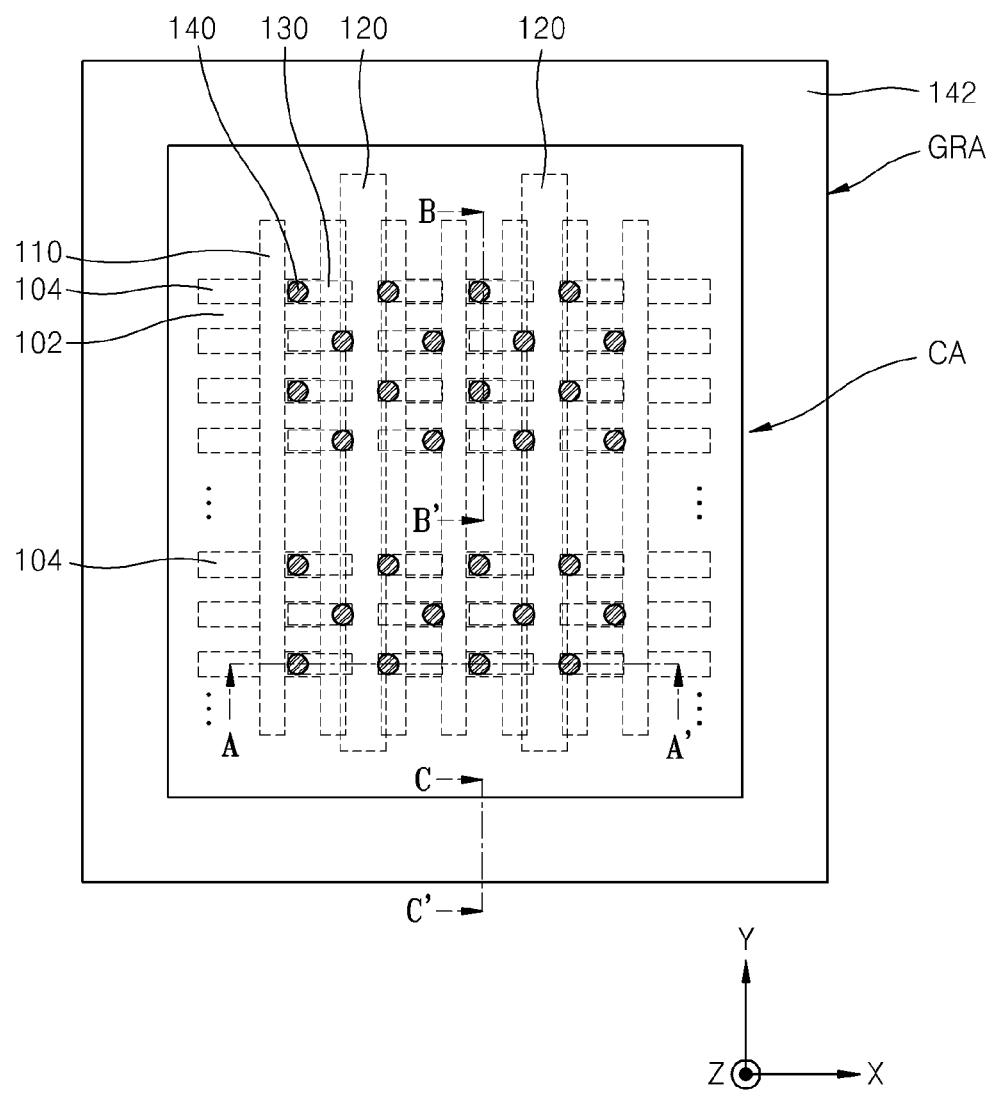
Figure 16B:
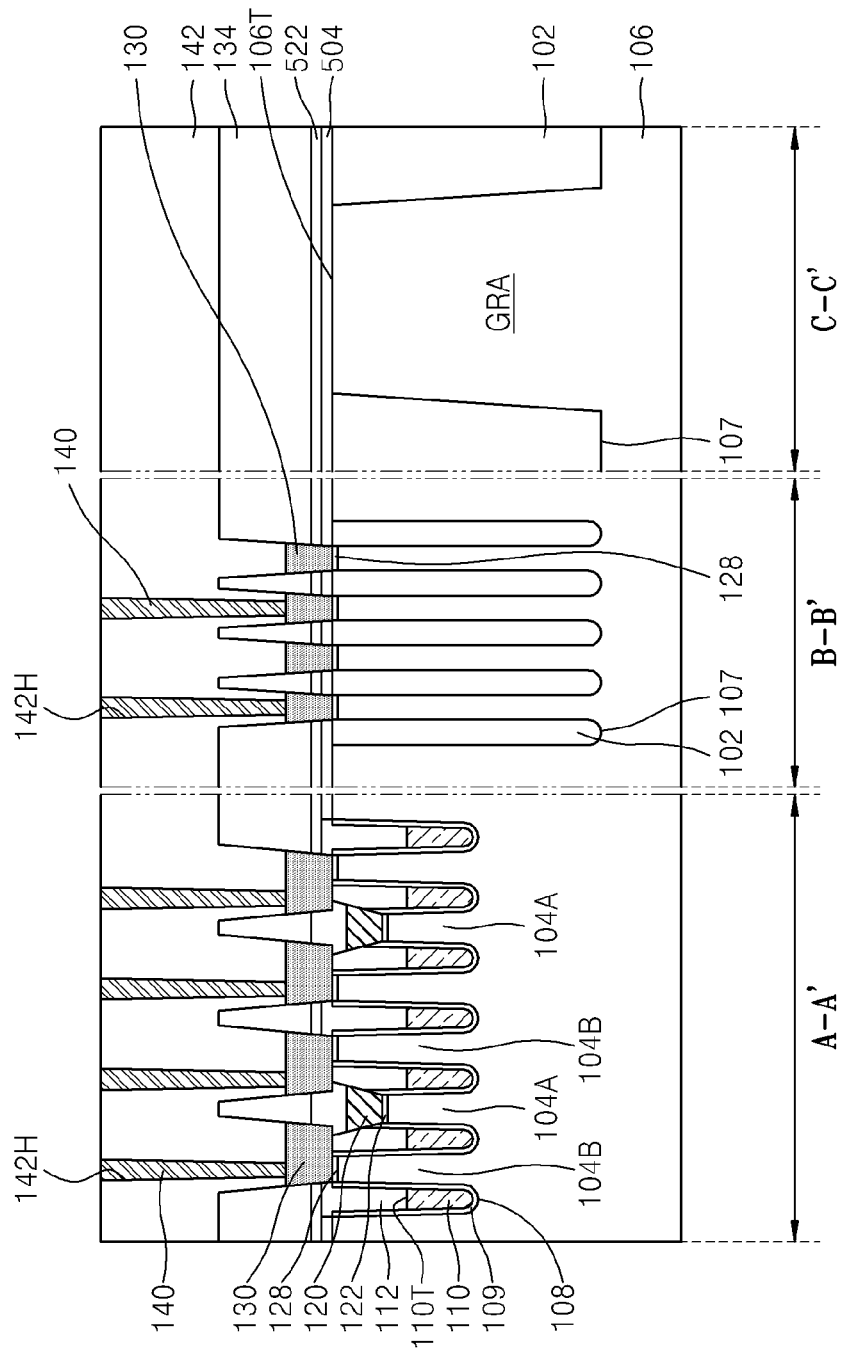

Referring to FIGS. 16A and 16B, a plurality of contact holes 142H exposing the plurality of contact pads 130 may be formed by etching a portion of the third insulating film 142.

Thereafter, the plurality of buried contact plugs 140 that fill the plurality of contact holes 142H may be formed. After forming a conductive layer filling the inside of the plurality of contact holes 142H, a portion of the conductive layer that exists outside the plurality of contact holes 142H may be removed using an etch back or chemical mechanical polishing (CMP) process.

According to one or more embodiments of the present inventive concepts, the plurality of buried contact plugs 140 may be formed of at least one material selected from the group including a metal, a conductive metal nitride, a metal-semiconductor composite, and a doped polysilicon.

Figure 17A:
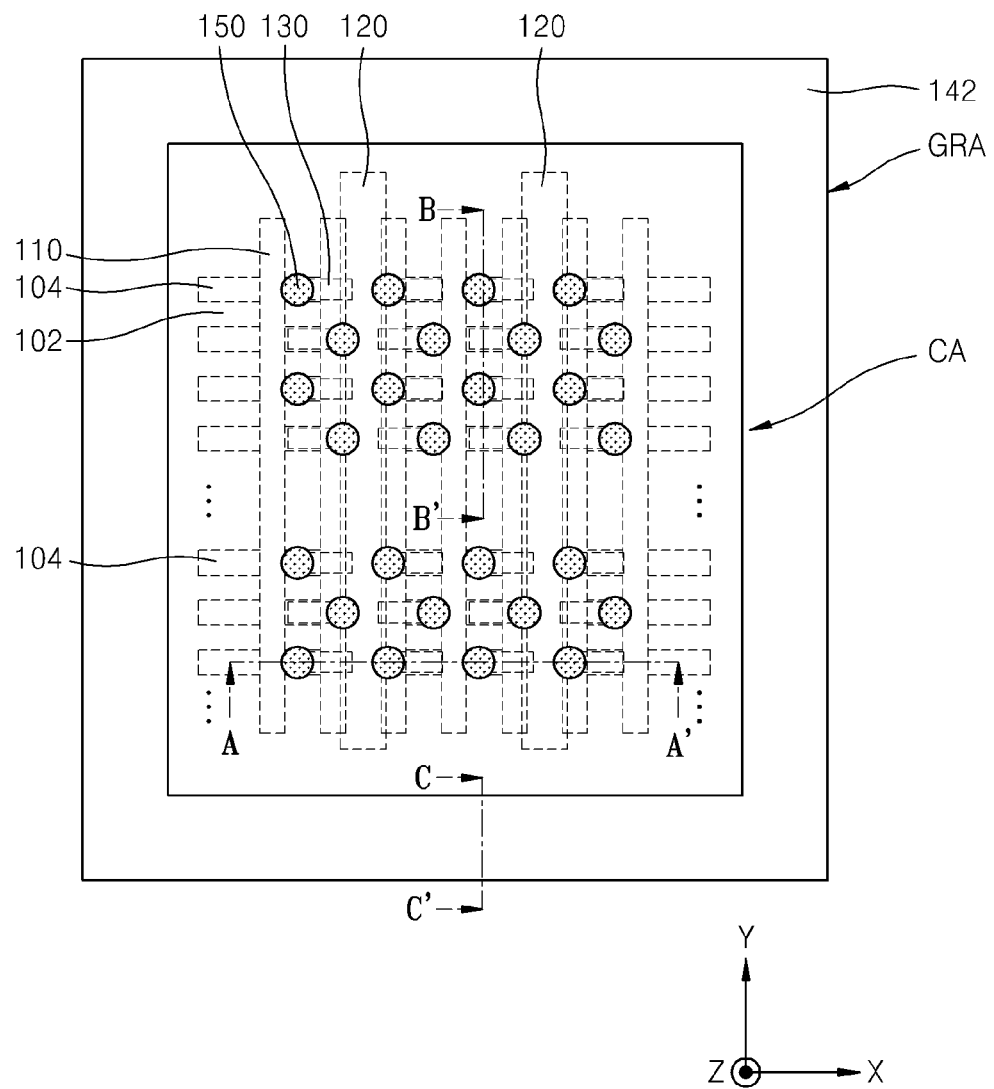
Figure 17B:
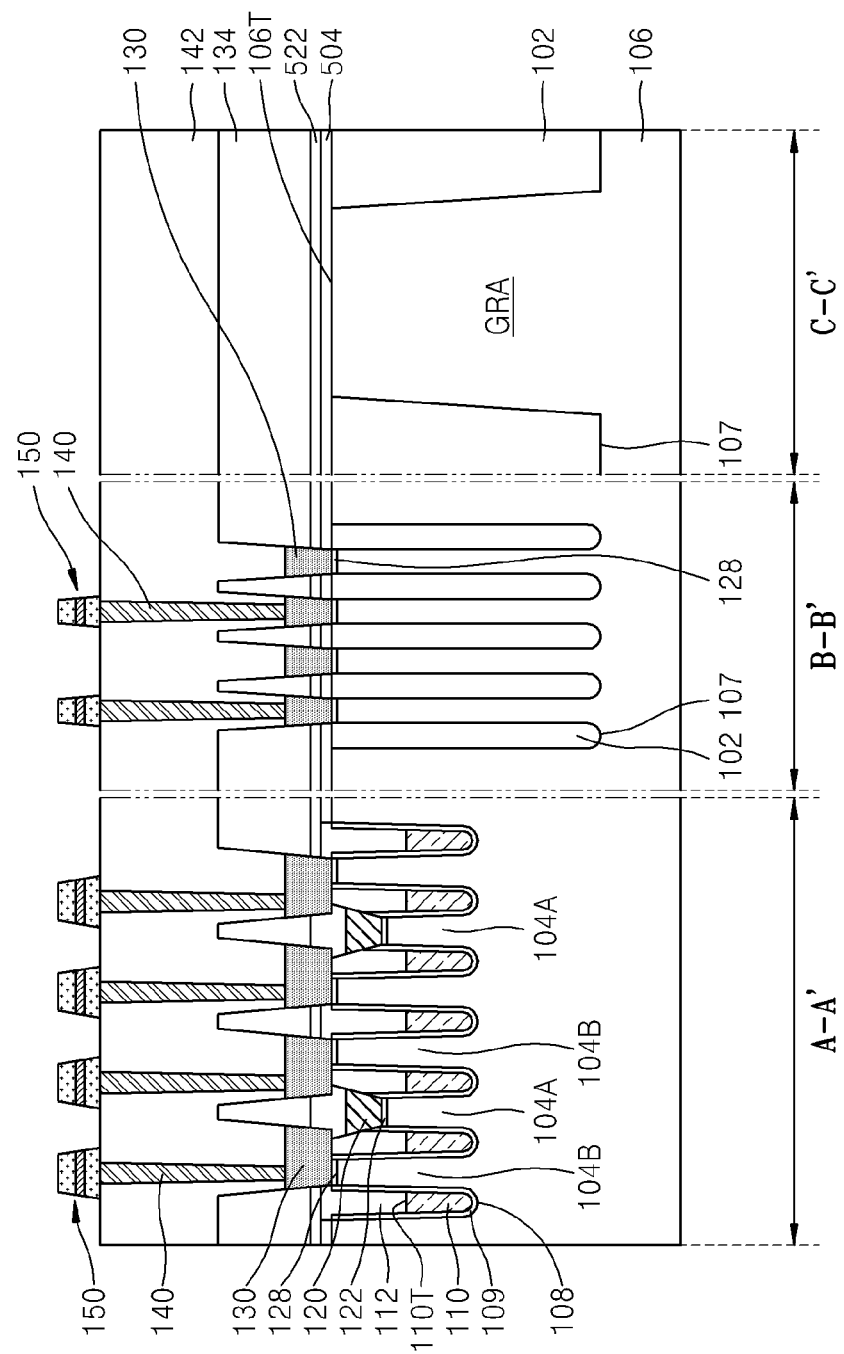

Referring to FIGS. 17A and 17B, the plurality of variable resistance structures 150, respectively connected to the plurality of buried contact plugs 140, may be formed on the third insulating film 142.

According to one or more embodiments of the present inventive concepts, the plurality of variable resistance structures 150 may be formed to have the structure described with reference to FIG. 4.

Figure 18A:
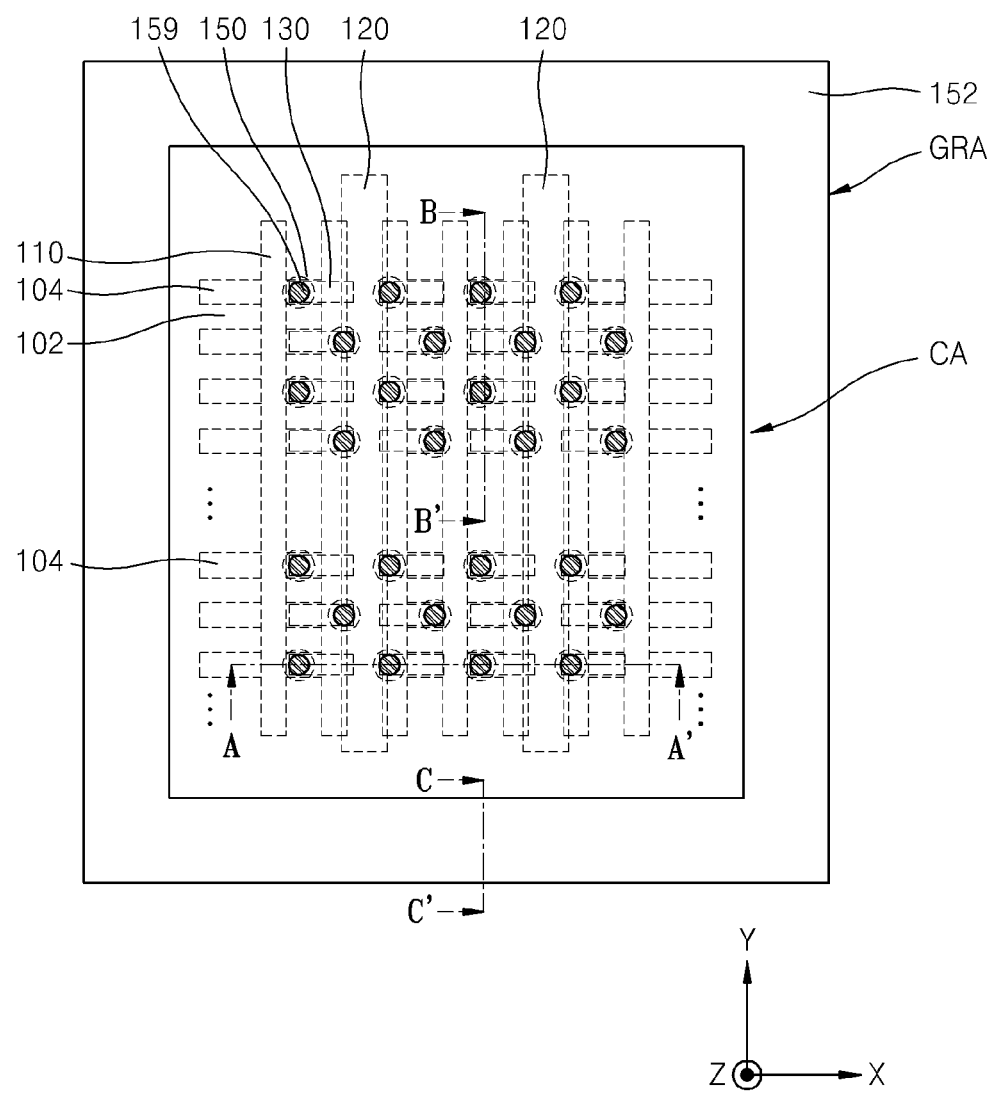

Referring to FIGS. 18A and 18B, the fourth insulation film 152 covering the plurality of variable resistance structures 150 may be formed. A plurality of contact holes 152H exposing electrodes of the plurality of variable resistance structures 150 (e.g., the upper electrodes 155 shown in FIG. 4), may then formed by removing a portion of the fourth insulation film 152. And the plurality of contact plugs 159 may be formed by filling in the plurality of contact holes 152H.

According to one or more embodiments of the present inventive concepts, the plurality of contact plugs 159 may be formed of at least one material selected from the group including a metal, a conductive metal nitride, a metal-semiconductor composite, and a doped polysilicon.

Figure 19A:
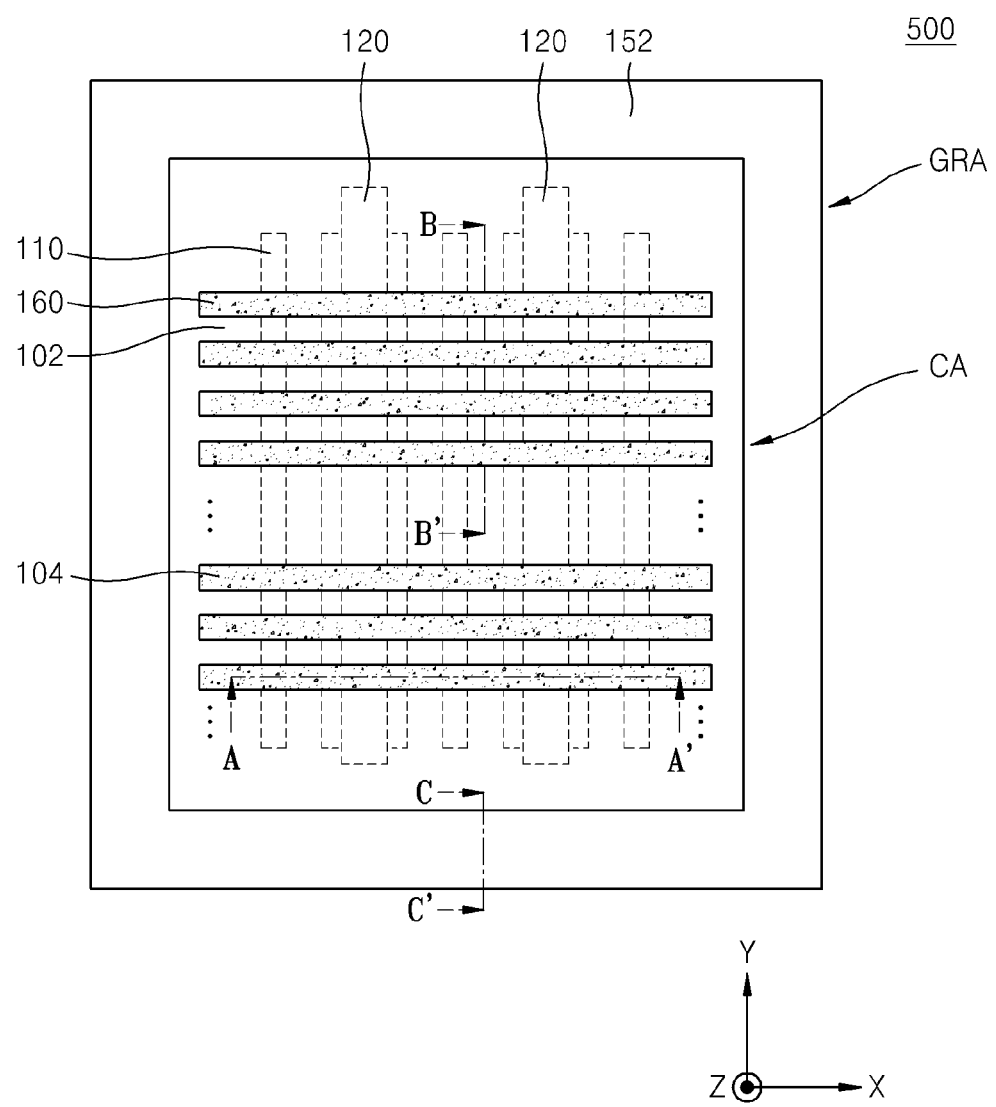
Figure 19B:
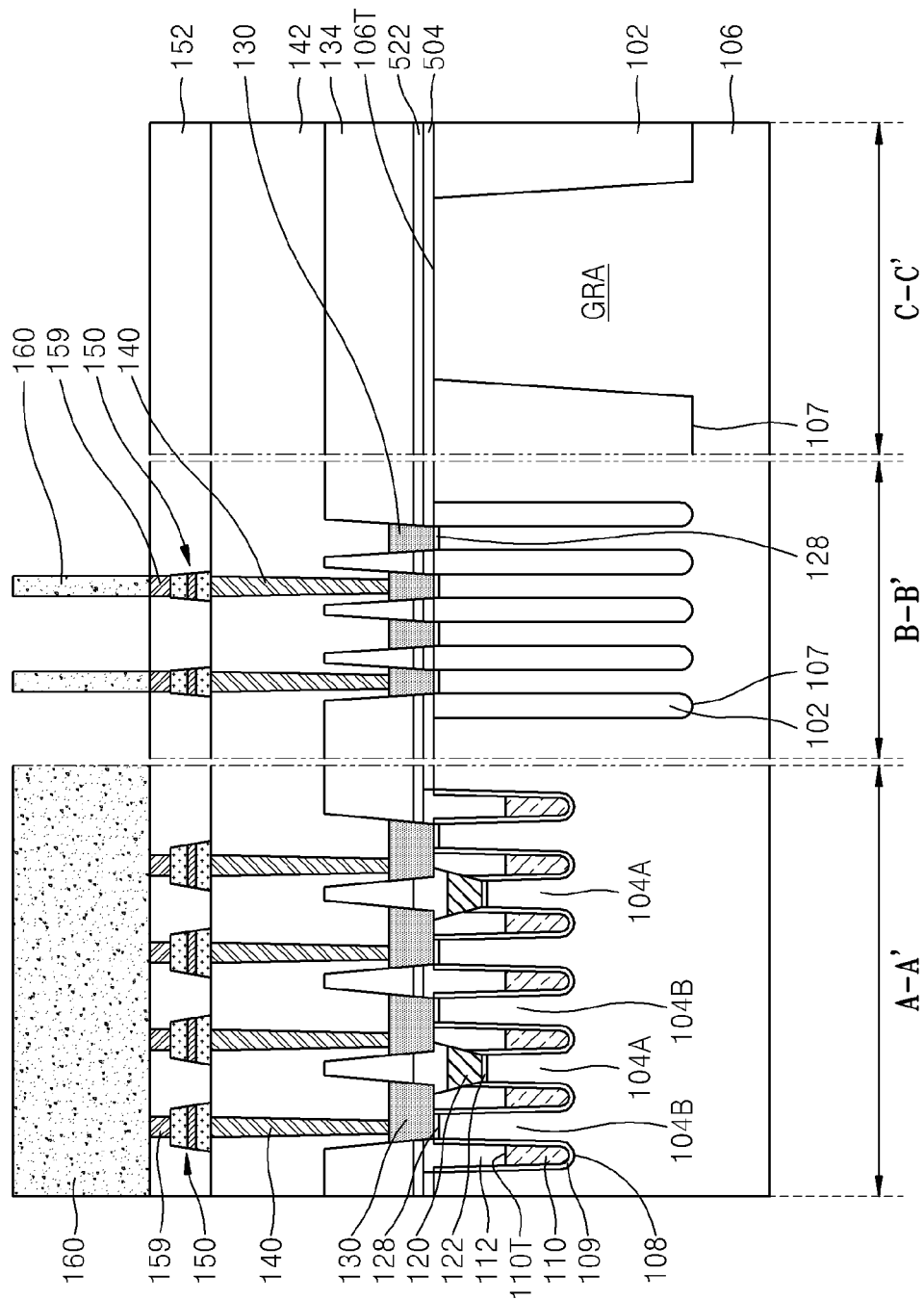

Referring to FIGS. 19A and 19B, the magnetic memory device 500 may be completed by forming the plurality of bit lines 160 on the fourth insulation film 152. The plurality of bit lines 160 may be connected to the plurality of variable resistance structures 150 via the plurality of contact plugs 159.

FIGS. 20A to 20D are somewhat schematic cross-sectional views illustrating a method of manufacturing a magnetic memory device 600 (see FIG. 20D) according to one or more embodiments of the present inventive concepts.

A method of manufacturing the magnetic memory device 600 (see FIG. 20D) will now be described with reference to FIGS. 20A to 20D. The magnetic memory device 600 may have a configuration in which an external source line 620R is formed connected to the plurality of source lines 120 similar to the configuration of the magnetic memory device 300 in FIGS. 6A and 6B, or may be similar to the magnetic memory device 400 in FIGS. 7A and 7B, in which the plurality of source lines 120 or 420 and the external source line 320R or 420R are formed in the cell array region CA.

FIGS. 20A to 20D are somewhat schematic cross-sectional views corresponding to cross-sections taken along line A-A', line B-B', and line C-C' of FIGS. 8A, 9A, . . . , 19A. Like reference numerals denote like elements, and redundant description thereof will be omitted.

Figure 20A:
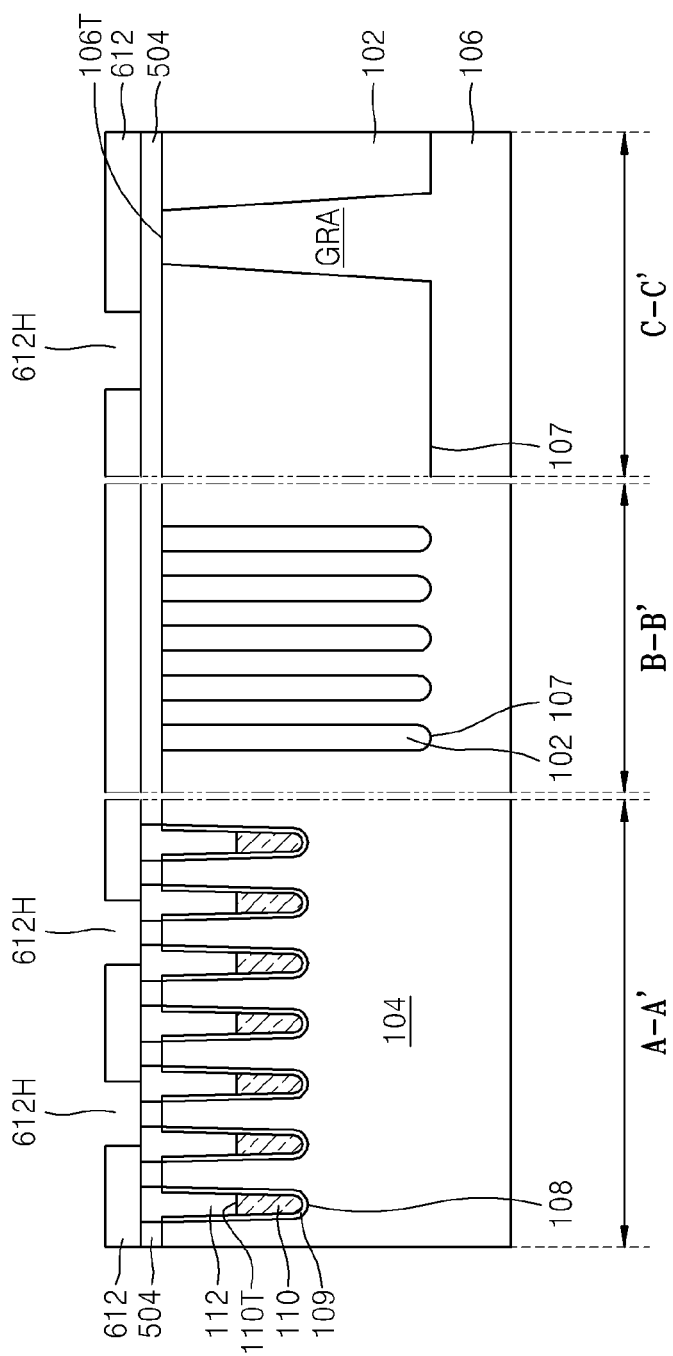
FIGS. 20A to 20D are somewhat schematic cross-sectional views of a magnetic memory device being constructed according to a method of manufacturing a magnetic memory device, illustrating a process order for manufacturing a magnetic memory device according to one or more embodiments of the present inventive concepts.

Referring to FIG. 20A, a series of processes, such as those described previously with reference to FIGS. 8A to 10B, may be performed. In FIG. 20A, however, instead of the mask pattern 512 illustrated in FIGS. 10A and 10B, a mask pattern 612 is used. The mask pattern 612 includes a plurality of contact holes 612H formed even on the device isolation film 102 in the cell array region CA that is adjacent to the guard ring active region GRA.

The mask pattern 612 is otherwise similar to the mask pattern 512 described previously with reference to FIGS. 10A and 10B.

Figure 20B:
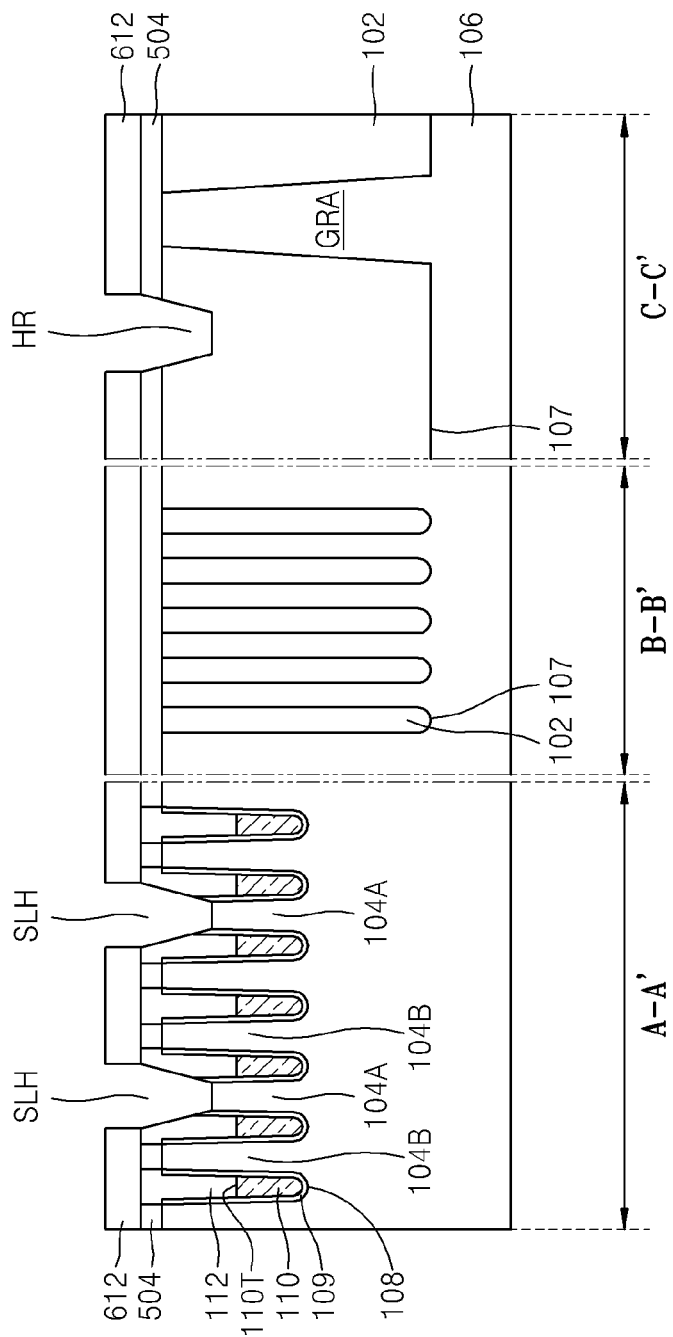

Referring to FIG. 20B, similar to the process described previously with reference to FIGS. 11A and 11B, a plurality of source line holes SLH are formed exposing the plurality of first active regions 104A and an external source line hole HR is formed exposing the device isolation film 102. The source line holes SLH and external source line hole HR are formed by etching the plurality of buried insulation films 112, the mask pattern 504, the plurality of gate dielectric films 109, the plurality of active regions 104, and the device isolation film 102 through the plurality of openings 612H (see FIG. 20A) using the mask pattern 612 as an etching mask.

Figure 20C:
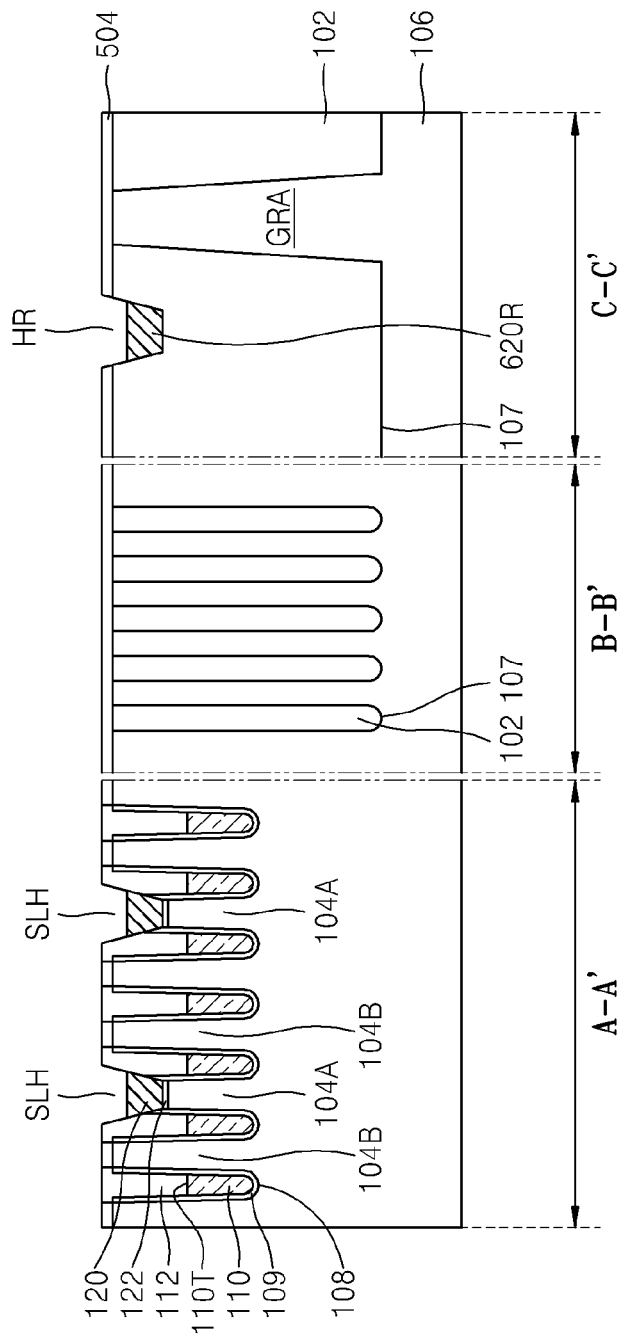

Referring to FIG. 20C, similar to the process described previously with reference to FIGS. 12A and 12B, the plurality of metal silicide films 122 may be formed on the upper surfaces of the plurality of first active regions 104A exposed through the plurality of source line holes SLH in the cell array region CA. Thereafter, the plurality of source lines 120 may be formed connected to the plurality of metal silicide films 122 in the plurality of source line holes SLH.

While forming the plurality of source lines 120, the external source line 620R may be simultaneously formed on the device isolation film 102.

Figure 20D:
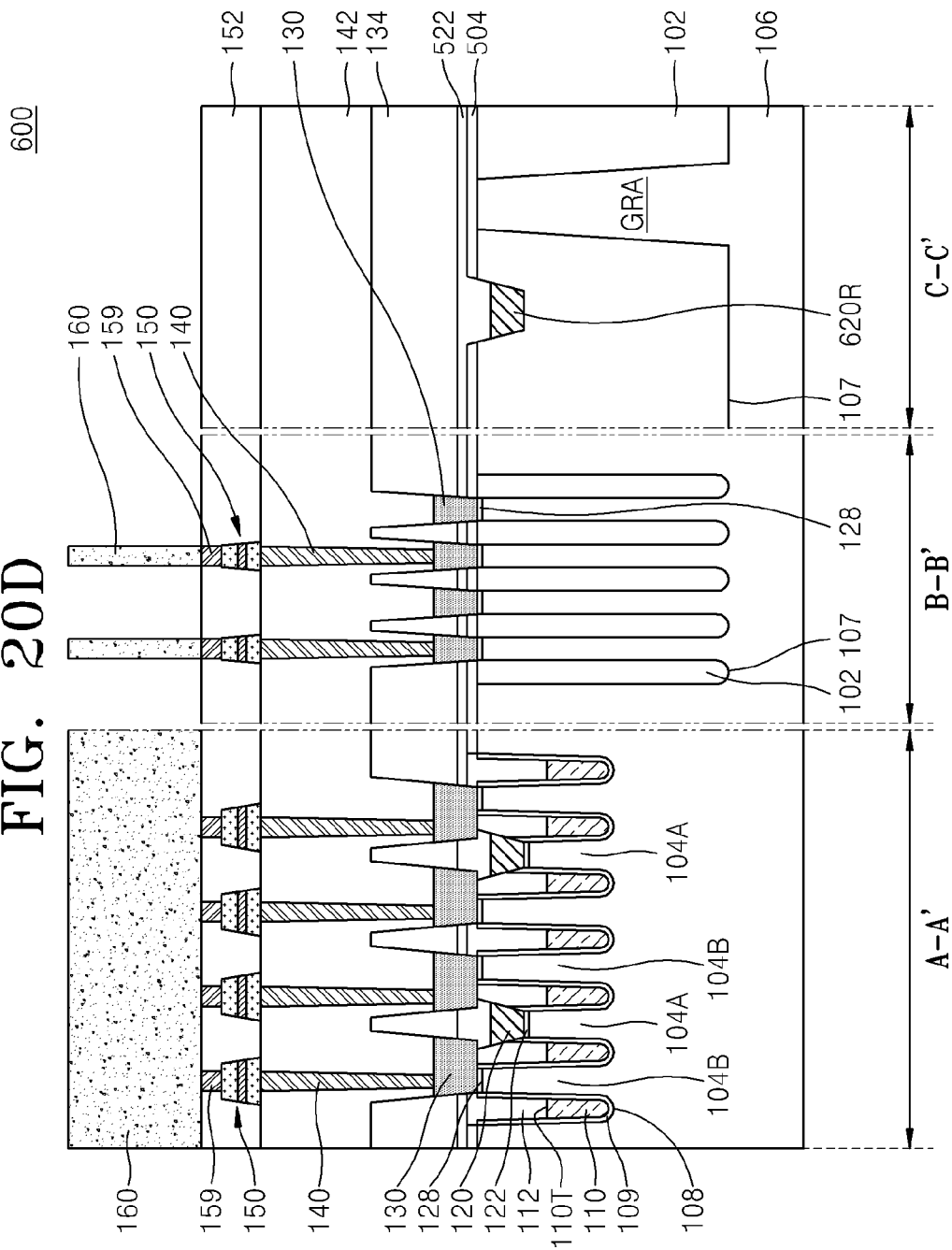

Referring to FIG. 20D, the magnetic memory device 600 may be completed by performing the processes described previously with reference to FIGS. 13A to 19B.

The magnetic memory device 100, 200, 300, 400, 500, or 600 according to one or more embodiments of the present inventive concepts may be implemented as semiconductor packages in various forms. For example, the magnetic memory device 100, 200, 300, 400, 500, or 600 according to one or more embodiments of the present inventive concepts may be packaged in any desired method, such as package on package (PoP), ball grid arrays (BGAs), chip scale packages (CSPs), plastic leaded chip carrier (PLCC), plastic dual in-line package (PDIP), chip on board (COB), ceramic dual in-line package (CERDIP), metric plastic quad flatpack package (MQFP), thin quad flat package (TQFP), small-outline integrated circuit (SOIC), shrink small outline package (SSOP), thin small outline package (TSOP), thin quad flat pack (TQFP), system in package (SIP), multi chip package (MCP), wafer-level fabricated package (WFP), wafer-level processed stack package (WSP), or the like.

Figure 21:
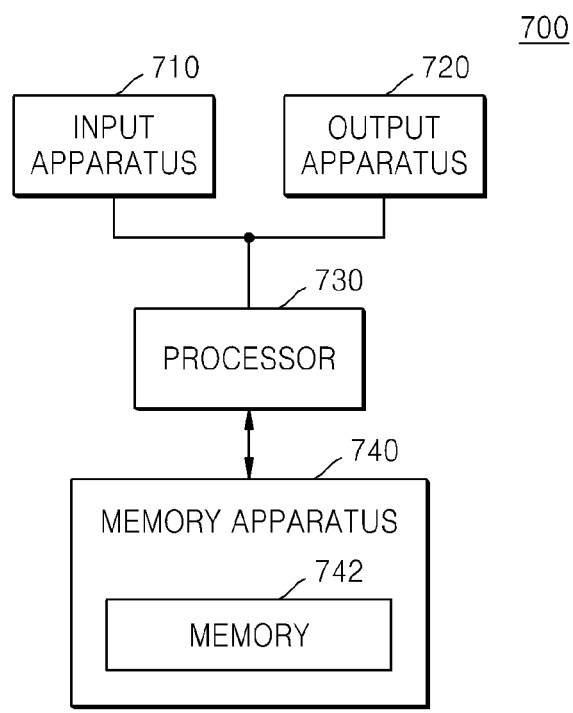
FIG. 21 is a schematic block diagram of an electronic system including a magnetic memory device according to one or more embodiments of the present inventive concepts.

FIG. 21 is a schematic block diagram of an electronic system 700 including the magnetic memory device 100, 200, 300, 400, 500, or 600 according to one or more embodiments of the present inventive concepts.

Referring to FIG. 21, the electronic system 700 may include an input apparatus 710, an output apparatus 720, a processor 730, and a memory apparatus 740. According to one or more embodiments of the present inventive concepts, the memory apparatus 740 may include a cell array, which includes a nonvolatile memory cell, and a peripheral circuit for operations, such as read, write, and the like. According to other one or more embodiments of the present inventive concepts, the memory apparatus 740 may include a nonvolatile memory apparatus and a memory controller.

A memory 742 included in the memory apparatus 740 may include at least one of the magnetic memory devices 100, 200, 300, 400, 500, and 600 constructed according to one or more embodiments of the present inventive concepts.

The processor 730 may be connected to the input apparatus 710, the output apparatus 720, and the memory apparatus 740 via an interface and control the general operation thereof.

Figure 22:
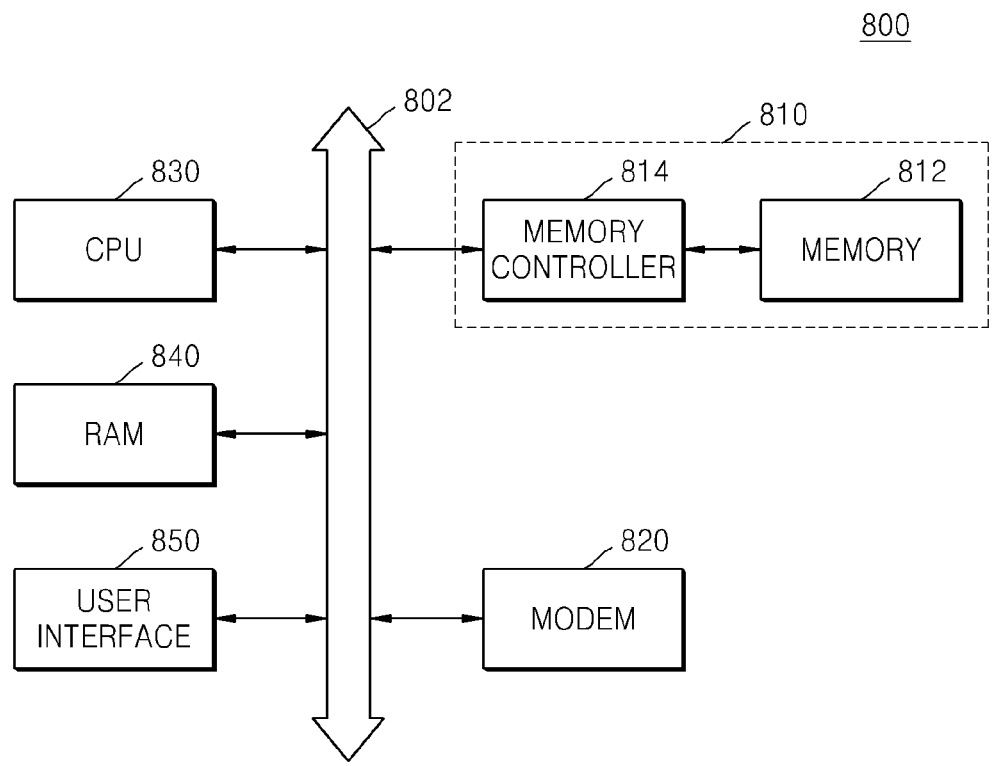
FIG. 22 is a schematic block diagram of an information processing system including a magnetic memory device according to one or more embodiments of the present inventive concepts.

FIG. 22 is a schematic block diagram of an information processing system 800 including the magnetic memory device 100, 200, 300, 400, 500, or 600 according to one or more embodiments of the present inventive concepts.

Referring to FIG. 22, the information processing system 800 may include a nonvolatile memory system 810, a modem 820, a central processing unit (CPU) 830, a random access memory (RAM) 840, and a user interface 850 that are electrically connected to a bus 802.

The nonvolatile memory system 810 may include a memory 812 and a memory controller 814. Data processed by the CPU 830 or data input from the outside may be stored in the nonvolatile memory system 810.

The nonvolatile memory system 810 may include nonvolatile memories, such as a magnetic RAM (MRAM), a parameter RAM (PRAM), a resistive RAM (RRAM), a ferroelectric RAM (FRAM), and the like. At least one of the memory 812 and the RAM 840 may include at least one of the magnetic memory devices 100, 200, 300, 400, 500, and 600 constructed according to one or more embodiments of the present inventive concepts described previously with reference to FIGS. 2 to 20D.

The information processing system 800 may, for example, be used for a portable computer, a web tablet, a wireless phone, a mobile phone, a digital music player, a memory card, an MP3 player, a navigation system, a portable multimedia player (PMP), a solid state disk (SSD), or household appliances.

Figure 23:
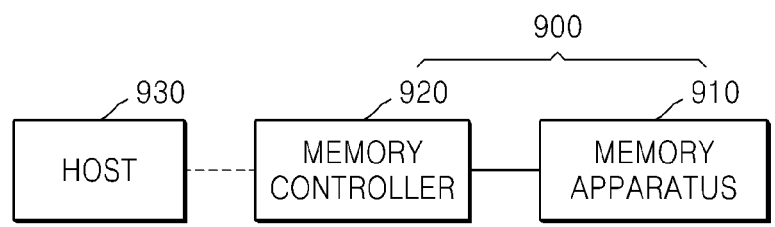
FIG. 23 is a schematic block diagram of a memory card including a magnetic memory device according to one or more embodiments of the present inventive concepts.

FIG. 23 is a schematic block diagram of a memory card 900 that may include a magnetic memory device 100, 200, 300, 400, 500, and 600 according to one or more embodiments of the present inventive concepts.

The memory card 900 may include a memory apparatus 910 and a memory controller 920.

The memory apparatus 910 may store data. According to one or more embodiments of the present inventive concepts, the memory apparatus 910 may have a nonvolatile characteristic in which stored data is maintained even during loss of power. The memory apparatus 910 may include at least one of the magnetic memory devices 100, 200, 300, 400, 500, and 600 constructed according to one or more embodiments of the present inventive concepts which have been described previously.

The memory controller 920 may read data stored in the memory apparatus 910 or store data in the memory apparatus 910 in response to a read or write request of a host 930. The memory controller 920 may include at least one of the magnetic memory devices 100, 200, 300, 400, 500, and 600 constructed according to one or more embodiments of the present inventive concepts which have been described previously.

While the inventive concepts have been particularly shown and described with reference to exemplary embodiments thereof, it will be understood that various changes in form and details may be made therein without departing from the spirit and scope of the following claims.

What is claimed is:
1. A magnetic memory device comprising:
   a substrate having a plurality of active regions defined therein, wherein the plurality of active regions extend parallel to each other along a first direction;
   a plurality of word lines, each word line extending on the plurality of active regions along a second direction that crosses the first direction;

at least one source line extending along the second direction, wherein said source line is connected to a plurality of first active regions selected from among the plurality of active regions;
a plurality of contact pads connected to a plurality of second active regions selected from among the plurality of active regions;
a plurality of buried contact plugs connected to the plurality of second active regions via the plurality of contact pads and arranged in a hexagonal array structure; and
a plurality of variable resistance structures connected to the plurality of second active regions via the plurality of contact pads and arranged in a hexagonal array structure.

2. The magnetic memory device of claim 1, wherein the plurality of word lines are located at a first level in the magnetic memory device, wherein the plurality of contact pads are located at a second level different from the first level, and wherein the at least one source line is arranged at a third level located between the first level and the second level.

3. The magnetic memory device of claim 1, wherein the plurality of contact pads contact an upper surface of the substrate.

4. The magnetic memory device of claim 1, wherein each of the plurality of variable resistance structures is arranged at a location at which one of the plurality of variable resistance structures vertically overlaps a corresponding one of the plurality of buried contact plugs.

5. The magnetic memory device of claim 1, wherein a first series of buried contact plugs among the plurality of buried contact plugs is arranged in a straight line along the first direction, and wherein a second series of buried contact plugs is arranged in a zigzag pattern.

6. The magnetic memory device of claim 1, wherein the plurality of word lines have a structure in which a pair of word lines forming a word line pair and one isolated word line are alternately and repeatedly arranged, and
wherein the at least one source line is connected to at least one of the plurality of active regions between the word lines in the word line pair.

7. The magnetic memory device of claim 1, wherein upper surfaces of a plurality of first active regions selected from among the plurality of active regions are located on a first level that is lower than an upper surface of the substrate between word lines in a word line pair, and
wherein upper surfaces of a plurality of second active regions selected from among the plurality of active regions are located on a second level that is higher than the first level at opposite sides of an isolated word line.

8. The magnetic memory device of claim 7, wherein the at least one source line contacts the upper surfaces of the plurality of first active regions, and
wherein the plurality of contact pads contact the upper surfaces of the plurality of second active regions.

9. The magnetic memory device of claim 1, wherein the at least one source line comprises a plurality of source lines arranged parallel to each other, and
wherein the plurality of source lines includes a plurality of partial source lines connected to each other.

10. The magnetic memory device of claim 1, further comprising a mesh source line extending across the plurality of source lines,
wherein partial source lines among the plurality of partial source lines are connected to each other via the mesh source line.

11. The magnetic memory device of claim 1, further comprising:
a mesh source line extending across the plurality of source lines and connecting at least a portion of the plurality of source lines to each other; and
an external source line connected to the mesh source line and arranged to surround the plurality of source lines.

12. A magnetic memory device comprising:
a substrate comprising a cell array region and a guard ring active region surrounding the cell array region, wherein a plurality of active regions are defined in the cell array region, and wherein said active regions extend substantially parallel to each other along a first direction;
a plurality of word lines arranged in the cell array region and extending substantially parallel to each other in a direction that crosses the plurality of active regions;
a plurality of source lines formed in the cell array region at a level that is lower than an upper surface of the substrate in the cell array region, said plurality of source lines contacting a plurality of first active regions selected from among the plurality of active regions;
an external source line connected to at least a portion of the plurality of source lines in the cell array region;
a plurality of buried contact plugs connected to a plurality of second active regions selected from among the plurality of active regions, said plurality of buried contact plugs arranged in a hexagonal array structure; and
a plurality of variable resistance structures connected to the plurality of second active regions via the plurality of contact pads and arranged in a hexagonal array structure.

13. The magnetic memory device of claim 12, further comprising at least one mesh source line extending across the plurality of source lines and connected to the plurality of source lines and the external source line.

14. The magnetic memory device of claim 12, wherein the external source line comprises a closed loop shape that extends around a periphery of the cell array region.

15. The magnetic memory device of claim 12, wherein the plurality of source lines comprises a first source line section and a second source line section arranged in a straight line and spaced apart from each other,
wherein the external source line comprises a first external source line section and a second external source line section spaced apart from each other,
wherein the first source line section is connected to only the first external source line section among the first and second external source line sections, and
wherein the second source line section is connected to only the second external source line section among the first and second external source line sections.

16. A magnetic memory device comprising:
a substrate having a device isolation film within a device isolation trench formed in the substrate;
a plurality of active regions defined on the substrate by the device isolation film, wherein said plurality of active regions extend substantially parallel to each other along a first direction;
a plurality of word lines formed in a plurality of gate trenches arranged in the substrate, the plurality of word lines extending in a second direction that crosses the first direction, the plurality of word lines comprising a plurality of word line pairs and a plurality of isolated word lines arranged between adjacent word line pairs, and wherein upper surfaces of each of the word lines are arranged at a first level below a second level corresponding to an upper surface of the substrate;

a plurality of buried insulation films arranged above the plurality of word lines in the gate trenches; and a plurality of source lines arranged parallel to the plurality of word lines, wherein each source line is arranged between word lines in a corresponding word line pair, and wherein each of the plurality of source lines is arranged at a third level that is higher than the first level but lower than the second level.

17. The magnetic memory device of claim 16, wherein the plurality of isolated word lines are electrically connected to each other through a conductive connection pattern.

18. The magnetic memory device of claim 16, wherein the plurality of active regions comprises a plurality of first active regions and a plurality of second active regions, wherein an upper surface level of the plurality of first active regions is lower than the second level and an upper surface level of the plurality of second active regions is substantially the same as the second level, and wherein the plurality of source lines are connected to the plurality of first active regions.

19. The magnetic memory device of claim 18, further comprising:

a plurality of buried contact plugs connected to the plurality of second active regions, said plurality of buried contact plugs arranged in a hexagonal array structure; and a plurality of variable resistance structures connected to the plurality of second active regions via the plurality of contact pads and arranged in a hexagonal array structure.

20. The magnetic memory device of claim 16, further comprising:

a mesh source line extending across the plurality of source lines; and a plurality of partial source lines, wherein partial source lines among the plurality of partial source lines are connected to each other via the mesh source line.

* * * * *